US010607896B2

(12) United States Patent
Ragnarsson et al.

(10) Patent No.: US 10,607,896 B2
(45) Date of Patent: Mar. 31, 2020

(54) METHOD OF FORMING GATE OF SEMICONDUCTOR DEVICE AND SEMICONDUCTOR DEVICE HAVING SAME

(71) Applicant: IMEC VZW, Leuven (BE)

(72) Inventors: Lars-Ake Ragnarsson, Heverlee (BE); Hendrik F.W. Dekkers, Tienen (BE); Tom Schram, Rixensart (BE); Julien Ryckaert, Schaerbeek (BE); Naoto Horiguchi, Leuven (BE); Mustafa Badaroglu, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/591,944

(22) Filed: May 10, 2017

(65) Prior Publication Data

US 2017/0330801 A1 Nov. 16, 2017

(30) Foreign Application Priority Data

May 11, 2016 (EP) ..................................... 16169098

(51) Int. Cl.
*H01L 21/8238* (2006.01)
*H01L 21/768* (2006.01)
(Continued)

(52) U.S. Cl.
CPC .... *H01L 21/823857* (2013.01); *H01L 21/022* (2013.01); *H01L 21/0214* (2013.01);
(Continued)

(58) Field of Classification Search
CPC ..... H01L 21/823821; H01L 21/823431; H01L 21/82345; H01L 21/823842;
(Continued)

(56) References Cited

U.S. PATENT DOCUMENTS 6,784,472 B2 * 8/2004 Iriyama ............. H01L 21/76895
257/288
9,082,851 B2 7/2015 Ramachandran et al.
(Continued)

FOREIGN PATENT DOCUMENTS

WO WO 2014/036855 A1 3/2014
WO WO 2015/094305 A1 6/2015

OTHER PUBLICATIONS

European Search Report dated Oct. 26, 2016 in European Application No. 16 16 9098.7; 9 pages.

*Primary Examiner* — Daniel Luke
(74) *Attorney, Agent, or Firm* — Knobbe, Martens, Olson & Bear LLP

(57) ABSTRACT

The disclosed technology generally relates to semiconductor devices and more particularly to a gate structure for a semiconductor device, and to methods of forming the same. In an aspect a method for forming a gate structure includes forming a first set of one or more semiconductor features and a second set of one or more semiconductor features. The method additionally includes forming a sacrificial gate extending across the semiconductor features of the first set and the semiconductor features of the second set. The method additionally includes forming a hole by etching the sacrificial gate, wherein the sacrificial gate is divided into a first sacrificial gate section and a second sacrificial gate section, forming a barrier in the hole by depositing a barrier material in the hole, removing the first sacrificial gate section and the second sacrificial gate section by etching wherein a first trench section is formed and a second trench section is formed, forming a first gate conductor in the first trench section and the second trench section, forming a mask above the second trench section, the mask exposing the first trench section, etching the first gate conductor in the first trench section, wherein the mask and the barrier counteracts (Continued)

etching of the first gate conductor in the second trench section, and forming a second gate conductor in the first trench section.

17 Claims, 8 Drawing Sheets

(51) Int. Cl.
    *H01L 29/66*           (2006.01)
    *H01L 21/84*           (2006.01)
    *H01L 21/02*           (2006.01)

(52) U.S. Cl.
    CPC ............... *H01L 21/76895* (2013.01); *H01L 21/823821* (2013.01); *H01L 21/823842* (2013.01); *H01L 21/823871* (2013.01); *H01L 21/823878* (2013.01); *H01L 21/845* (2013.01); *H01L 29/66545* (2013.01)

(58) Field of Classification Search
    CPC ..... H01L 21/823475; H01L 21/823871; H01L 29/66545; H01L 21/823878; H01L 21/823481; H01L 21/76895; H01L 29/4236
    See application file for complete search history.

(56) References Cited

U.S. PATENT DOCUMENTS

| | | | |
|---|---|---|---|
| 9,331,074 | B1 | 5/2016 | Chang et al. |
| 9,559,205 | B2* | 1/2017 | Chang ................ H01L 29/785 |
| 9,601,567 | B1* | 3/2017 | Hsieh ................ H01L 29/785 |
| 9,929,242 | B2* | 3/2018 | Chang ................ H01L 21/845 |
| 2003/0173589 | A1* | 9/2003 | Ruf ................ H01L 21/76843 |
| | | | 257/200 |
| 2007/0267751 | A1* | 11/2007 | Yang ................ H01L 21/288 |
| | | | 257/758 |
| 2010/0072553 | A1 | 3/2010 | Xu et al. |
| 2012/0012937 | A1 | 1/2012 | Chew et al. |
| 2012/0104509 | A1* | 5/2012 | Matsumoto ..... H01L 21/823814 |
| | | | 257/369 |
| 2013/0187235 | A1 | 7/2013 | Huang et al. |
| 2014/0145267 | A1 | 5/2014 | Cao et al. |
| 2014/0151801 | A1 | 6/2014 | Haran et al. |
| 2014/0319623 | A1* | 10/2014 | Tsai ................ H01L 29/7855 |
| | | | 257/401 |
| 2015/0249086 | A1 | 9/2015 | Divakaruni et al. |
| 2015/0372109 | A1 | 12/2015 | Chou et al. |
| 2015/0380305 | A1 | 12/2015 | Basker et al. |
| 2016/0005831 | A1 | 1/2016 | Ando et al. |
| 2016/0181425 | A1* | 6/2016 | Bai ................ H01L 29/7848 |
| | | | 438/283 |
| 2017/0345820 | A1* | 11/2017 | Lin ................ H01L 21/823481 |

\* cited by examiner

METHOD OF FORMING GATE OF SEMICONDUCTOR DEVICE AND SEMICONDUCTOR DEVICE HAVING SAME

CROSS-REFERENCE TO RELATED APPLICATIONS

This application claims foreign priority to European Patent Application No. EP 16169098.7, filed May 11, 2016, the content of which is incorporated by reference herein in its entirety.

BACKGROUND

Field

The disclosed technology generally relates to semiconductor devices and more particularly to a gate structure for a semiconductor device, and to methods of forming the same.

Description of the Related Technology

Some semiconductor devices, e.g., complementary metal oxide semiconductor (CMOS) devices, include transistors having metal gates. In some CMOS technologies, metal gates are formed using what is known in the art as a "gate first" process, while in some other CMOS technologies, metal gates are formed using what is known as a "gate last" process, which is sometimes referred to as a replacement metal gate (RMG) process. In a "gate first" process, a gate stack or a gate structure is formed by depositing a gate layer and subsequently patterning the gate layer by etching. In contrast, in an RMG process, a sacrificial gate structure is formed first, followed by removal and replacement of the sacrificial gate structure with a permanent gate stack or a gate structure. In some RMG processes, a gate-stack or a gate structure is formed over a channel by deposition of a dielectric layer (e.g., a high K-dielectric) and a metal layer formed in a trench formed by removal of the sacrificial gate structure. The trench may be formed by removing a sacrificial gate, e.g., a polysilicon sacrificial gate, to expose the channel region, e.g., the dielectric layer on the channel region. The dielectric and metal layers may be deposited by atomic layer deposition (ALD) to cover the entire substrate surface including the channel structure. ALD is typically a conformal process, in which surfaces of structures having relatively complex topographies can be covered by a layer having a relatively uniform thickness.

Many device types, such as complementary metal oxide semiconductor (CMOS) devices, include a combination of an n-channel MOS (nMOS) device and a p-channel MOS (pMOS) device having gates that may be electrically connected to each other. For instance, the nMOS device may be formed by an n-channel FinFET and the pMOS device may be formed by a p-channel FinFET. Such nMOS and pMOS devices formed by an RMG process may include a trench which extends uninterrupted between the nMOS device and the pMOS device, and across the n-channel fins and the p-channel fins.

Following the metal deposition, the metal layer may cover the portions of the n-channel fins and the p-channel fins extending through the trench, as well as the sidewalls of the trench. The metal layer may completely or partially fill the trench. To set the threshold voltage $V_T$ of the device, the work function of the metal on the nMOS-side and pMOS-side, respectively, however may to selected or tuned to be relatively close to the respective semiconductor band edges. Hence, the effective work function (eWF) may be adjusted on the nMOS-side or pMOS-side, depending on whether a pMOS work function metal (pWFM) or an nMOS work function metal (nWFM) was first deposited.

In some RMG processes, the gate structures may be formed by removing (completely or partially) the metal layer from the trench on the nMOS-side or the pMOS-side by patterning and etching of the metal layer, and subsequently depositing a new work function metal (WFM). For example, if the metal layer to be removed is in the nMOS-side, a mask (e.g. a resist or a hard mask) may be formed above the gate trench to cover the pMOS-side (in which the metal layer should remain). The edge of the mask will hence be approximately half way between the nMOS device and the pMOS device. This position may be referred to as the n/p boundary. When the etching starts, the metal is mainly removed from the intended region, but as it proceeds some undercutting (under the mask) may occur.

SUMMARY OF CERTAIN INVENTIVE ASPECTS

For trenches having a width which is large compared to the thickness of the metal layer, the undercutting may not considerably exceed the thickness of the metal layer, even for isotropic etching processes. However, as realized by the inventors, for node dimensions wherein the width of the trench approaches the thickness of the metal layer, the undercutting may become an increasing issue. Especially, if an isotropic etch is used the undercutting may even be as deep as the trench. The WFM may then be etched not only on the nMOS-side (or pMOS-side), where it is intended to be etched, but also on the pMOS-side (or nMOS-side). Hence, the subsequent deposition of the new WFM may end up also on the pMOS (or nMOS) device rendering thereby the eWF at the pMOS (or nMOS) device too low (or too high) and therefore a too high threshold voltage $V_T$.

Undercutting may be limited by using anisotropic etching processes. However, as device dimensions shrink it becomes desirable to use etching having at least some isotropic component, to facilitate etching of the metal layer inside also relatively narrow trenches.

It is a general objective of the present inventive concept to address these issues. Further objectives and advantages of the present inventive concept may be understood from the following.

According to a first aspect of the present inventive concept there is provided a method for forming a gate structure at a first region and a second region of a substrate, the first region including a first set of one or more semiconductor features and the second region being adjacent to the first region and including a second set of one or more semiconductor features, wherein a sacrificial gate is arranged in a dielectric layer and extends between the first region and the second region and across the one or more semiconductor features of the first set and the one or more semiconductor features of the second set, the method comprising: forming a hole by etching the sacrificial gate at a boundary between the first region and the second region wherein the sacrificial gate is divided into a first sacrificial gate section and a second sacrificial gate section, forming a barrier in the hole by depositing a barrier material in the hole, removing the first sacrificial gate section and the second sacrificial gate section by etching wherein a first trench section is formed in the dielectric layer at the first region and a second trench section is formed in the dielectric layer at the second region, forming a first gate conductor in the first trench section and the second trench section, forming a mask above the second trench section, the mask exposing the first trench section, etching the first gate conductor in the first trench section, wherein the mask and the barrier counteracts etching of the first gate conductor material in the second trench section, and forming a second gate conductor in the first trench section.

In another aspect, a method of forming a complementary metal oxide (CMOS) device comprises forming a plurality of first elongated semiconductor active structures extending in a first direction and doped with a dopant of a first type and forming a plurality of second elongated semiconductor active structures extending in the first direction and doped with a dopant of a second type. The first and second active structures may be, e.g., n and p type active structures for nMOS and pMOS transistors. The method additionally includes forming a sacrificial gate line over and traversing the first and second active structures in a second direction crossing the first direction. The method additionally includes removing and replacing with a barrier material a portion of the sacrificial gate line between the first and second elongated semiconductor active structures. The method additionally includes selectively removing against the barrier material remaining portions of the sacrificial gate line, thereby forming a first empty volume formed by removing a first remaining portion of the sacrificial gate line over the first active structures, and forming a second empty volume formed by removing a second remaining portion of the sacrificial gate line over the second active structures. The method additionally includes depositing a first gate metal layer having a first work function in the first and second empty volumes and replacing the first gate metal layer in the first empty volume with a second gate metal layer having a second work function, The first and second work functions are different by at least 0.3 eV, 0.5 eV or 0.7 eV, such that one of the first and second metals having a higher of the two work functions is adapted for a pMOS transistor, while other one of the first and second metals having a lower of the two functions is adapted for an nMOS transistor.

By the inventive method, a first gate structure section including the second gate conductor may be formed in the first trench section and a second gate structure section including the first gate conductor may be formed in the second trench section. The first gate structure section and the second gate structure section may be formed on opposite sides of the barrier. Accordingly, a replacement metal gate structure including the first gate structure section and the second gate structure section may be formed. The gate structure may be common to or shared by the first region and the second region.

According to the inventive method, a barrier is formed which enables a first trench section and a second trench section to be formed on opposite sides of the barrier. In other words, the barrier may separate the first trench section from the second trench section.

Following the act of removing the first and the second sacrificial gate sections, a portion of each semiconductor feature of the first set of semiconductor features may be exposed within the first trench section and a portion of each semiconductor feature of the second set of semiconductor features may be exposed within the second trench section. The first gate conductor (and subsequently the second gate conductor) may thus be formed above and/or around the exposed portions of the semiconductor features.

By virtue of the barrier and the mask the first gate conductor may be selectively etched in the first trench section due to the mask and the barrier at least counteracting, and preferably preventing, etching of the first conducting material in the second trench section. The issue of undercutting the mask may hence be avoided or at least reduced also if isotropic etching is used for etching the first gate conductor.

The second gate conductor may form a first WFM and the first gate conductor may form a second WFM, different from the first WFM. Thus, a first eWF may be obtained in the first region and a second eWF may be obtained in the second region.

The (one or more) semiconductor features of the first set may form an n-channel and the (one or more) semiconductor features of the second set may form a p-channel, or vice versa. Accordingly, the first region may be referred to as an n-channel region and the second region may be referred to as a p-channel region, or vice versa. Accordingly, the inventive method enables forming of a pWFM in the p-channel region and an nWFM in the n-channel region, or vice versa.

In the following, a WFM of a given type (e.g. an nWFM or a pWFM) is used to refer to one metal layer or to two or more (i.e. a stack of) metal layers of a composition such that, when deposited in the first trench section (or the second trench section), a desired eWF is obtained for the first set of semiconductor features (or the second set of semiconductor features). In this context, the terminology "metal layer" should be understood as a metal-including layer, i.e. a material layer including a metal.

By the method the first gate conductor may be etched in the first trench section in a selective manner, avoiding etching of the first gate conductor in the second trench section. Consequently, the method makes it possible to obtain a structure wherein the intended type of WFM is formed on the n-channel region and on the p-channel region, respectively. A device with desired threshold voltages for both the n-channel and the p-channel may hence be achieved.

The barrier material used for forming the barrier may present an etch rate which is lower than an etch rate of the first gate conductor with respect to an etching process used for etching the first gate conductor in the first trench. Thereby, the barrier material of the barrier may provide the barrier with an etch stopping power and thus directly act as an etch barrier between the first trench section and the second trench section.

Alternatively, a further material layer may be arranged on the barrier which further material layer presents an etch rate which is lower than an etch rate of the first gate conductor with respect to an etching process used for etching the first gate conductor in the first trench. Thereby, the barrier may support a further material layer having an etch stopping power and thus enable forming of an etch barrier between the first trench section and the second trench section. In other words, the barrier may indirectly act as an etch barrier between the first trench section and the second trench section by supporting the further material layer.

According to a further alternative a combination of a barrier material providing the barrier with an etch stopping power and a further material layer providing the barrier with a further etch stopping power is envisaged.

The barrier material may be deposited as a conformal layer on surfaces exposed in the hole. The barrier may hence be provided with a continuous and uniform outer surface.

The method may further comprise, subsequent to depositing the barrier material in the hole, filling a remaining space in the hole with a filler material. This may simplify planarization of the device and/or improve the stability of the barrier.

The barrier material and/or the filler material forming the barrier may be a (respective) dielectric material. This may enable reduction of the parasitic capacitance of the gate structure since the dielectric thickness may be increased between any metal layers present above the barrier and the substrate underneath.

The method may further comprise, subsequent to depositing the filler material, removing portions of the barrier material and the filler material deposited outside the hole by chemical mechanical polishing. The structure may thereby be planarized following formation of the barrier. This may simplify later stages of the process.

The act of etching of the first gate conductor in the first trench section may be performed using an isotropic etching process. This may facilitate removal of the first gate conductor.

The act of etching of the first gate conductor in the first trench section may be performed to only partially remove the first gate conductor in the first trench section. In some applications and/or for some types of WFMs it may be advantageous to only partially remove the first gate conductor in the first trench section, e.g. to keep a thin layer of the first gate conductor in the first trench section to form a bottom layer of the second gate conductor. Preferably, the first gate conductor is removed from the first trench section to such an extent that the later forming of the second gate conductor in the first trench section enables forming of a first gate structure section resulting in a desired eWF for the first set of semiconductor features in the first region.

Alternatively, the act of etching of the first gate conductor in the first trench section may be performed to completely remove the first gate conductor from the first trench sections. In some applications and/or for some types of WFMs it may be advantageous to completely remove the first gate conductor in the first trench section, e.g. to facilitate obtaining a desired eWF for the first set of semiconductor features in the first region.

According to one embodiment the method further comprises, prior to forming the first gate conductor, depositing a high-K gate dielectric layer on exposed surfaces in the first trench section and the second trench section, and wherein the first gate conductor is formed on the gate dielectric layer. The exposed surfaces in the first trench section may include the surface formed by the sidewall of the barrier facing the first trench section. The high-K gate dielectric layer may accordingly be deposited on the sidewall of the barrier. The high-K gate dielectric layer deposited on the sidewall of the barrier may counteract etching of the first gate conductor in the second trench section during the act of removing the first gate conductor from the first trench section. The high-K gate dielectric layer may accordingly function as the above-mentioned further material layer presenting an etch rate which is lower than an etch rate of the first gate conductor with respect to an etching process used for etching the first gate conductor in the first trench. Thus, the high-K gate dielectric may have a double function in providing etch stopping power to the barrier during the method and to function as a high-K gate dielectric layer in a finished device.

The exposed surfaces in the second trench section may correspondingly include the surface formed by the sidewall of the barrier facing the second trench section. The high-K gate dielectric layer may accordingly be deposited on also this sidewall of the barrier.

According to one embodiment the barrier material has an etch rate which is lower than an etch rate of a material forming the first sacrificial gate section and the second sacrificial gate section with respect to an etching process used for removing the first sacrificial gate section and the second sacrificial gate section. This simplifies forming of the first trench section and the second trench section since the selectivity of the etching with respect to the first sacrificial gate section and the second sacrificial gate section may be increased with respect to the barrier.

According to one embodiment the sacrificial gate is arranged on a sacrificial dielectric and the method further comprises, subsequent to removing the first sacrificial gate section and the second sacrificial gate section, and prior to depositing the gate dielectric, removing the sacrificial dielectric by etching the sacrificial dielectric from exposed surfaces in the first trench section and/or the second trench section.

According to one embodiment a spacer layer is formed on sidewalls of the sacrificial gate. A spacer layer enables formation of a gate structure of a reduced gate length.

According to one embodiment forming the first gate conductor includes depositing one or more metal layers in the first trench section and the second trench section, and wherein forming the second gate conductor includes depositing one or more metal layers in the first trench section. Forming a gate conductor by a single metal-including layer may simplify the overall process. Forming a gate conductor by more than one metal-including layer may provide improved flexibility in obtaining a gate conductor with the desired process properties and/or electrical properties.

Accordingly, a first gate structure section may be formed in the first trench section and may include the one or more metal layers of the second gate conductor. If the first gate conductor is only partially removed from the first trench section, the first gate structure section may additionally include any layers (or portions of layers) of the first gate conductor remaining in the first trench section after the etching of the first gate conductor.

Correspondingly, a second gate structure section may be formed in the second trench section and may include the one or metal layers of the first gate conductor. If the second gate conductor is formed also in the second trench section (i.e. on the first gate conductor therein) the second gate structure section may additionally include any layers of the (or portions of layers) of the second gate conductor deposited in the second trench section.

Regardless of the specific layer configuration of the first and the second gate structure sections, preferably, the first gate structure section is adapted to function as a WFM of a type (e.g. n-type or p-type) corresponding to the type (e.g. n-type or p-type) of the first region, and the second gate structure section is adapted to function as a WFM of a type (e.g. p-type or n-type) corresponding to the type (e.g. p-type or n-type) of the second region.

A pWFM may include at least one layer of TiN, TaN or TiTaN. An nWFM may include at least one layer of Al, TiAl, TiC or TiAlC.

Each of the one or more layers of the first gate conductor may be deposited (sequentially) on exposed surfaces in the first trench section and in the second trench section. Each of the one or more layers of the second gate conductor may be deposited (sequentially) on exposed surfaces in the first trench section and (optionally) also in the second trench section. It may be advantageous, for process reasons, to deposit a metal layer sequentially. Thus one or more of the one or more layers of the first and/or second gate conductor may be formed by two or more sub-layers of a same material, formed directly on top of each other.

According to one embodiment the method further comprises forming the second gate conductor also on the first gate conductor in the second trench section. In the event that the second trench section is not fully filled by the first gate conductor, any remaining space may thereby be filled by the second gate conductor. This may facilitate obtaining a planar structure.

According to one embodiment the method further comprises, subsequent to forming the second gate conductor, filling a remaining space in the first trench section with a filler material. This may simplify planarization of the structure, and improve the uniformity of the gate stack. The filler material may be deposited to also fill a remaining space in the second trench section. The filler material may present a resistivity which is lower than the resistivity of the second (and first) gate conductor. The deposition of the filler material may thereby bring about the additional advantage of reducing the overall resistivity of the gate structure.

According to one embodiment the method further comprises electrically connecting the first gate structure section to the second gate structure section. An electrically common gate structure may hence be obtained with the desired properties with respect to both the first region and the second region. A recess may be formed by etching the first gate structure section, the second gate structure section and the barrier. A connection layer may be formed in the recess for electrically connecting the first gate structure section and the second gate structure section.

According to one embodiment the method further comprises: subsequent to forming the second gate conductor, forming in the dielectric layer a recess extending between the first trench section and the second trench section, and depositing a connection layer in the recess for electrically connecting the first gate conductor in the second trench section to the second gate conductor in the first trench section. Electrically connected first and second gate conductors may thereby be provided. The recess may be formed by etching the second gate conductor in the first trench section, the barrier and the first and/or second gate conductor in the second trench section (depending on whether the second gate conductor is formed on the first gate conductor in the second trench section or not). If a filler material has been deposited in the first trench section (and optionally in the second trench section) also the filler material may be etched in the first trench section (and optionally in the second trench section) during the forming of the recess. If a gate dielectric layer is present on sidewalls of the barrier, forming the recess may include etching also the gate dielectric layer.

By forming a connection layer in a recess an electrical connection may be achieved without adding to the thickness of the structure. The recess may extend between the first region and the second region, across the semiconductor features of the first set and the semiconductor features of the second set.

The method may further comprise filling a remaining space in the recess by depositing a conducting filler material on the connection layer in the recess. In the event that the recess is not fully filled by the connection layer, any remaining space may thereby be filled by the conducting filler material. This may simplify planarization of the structure, and improve the uniformity of the gate stack. The conducting filler material may present a resistivity which is lower than the resistivity of the connection layer. The deposition of the filler material may thereby bring about the additional advantage of reducing the overall resistivity of the gate structure According to a second aspect of the present inventive concept there is provided a semiconductor device comprising: a first set of one or more semiconductor features arranged at a first region of a substrate and a second set of one or more semiconductor features arranged at a second region of the substrate being adjacent to the first region, a barrier arranged in a dielectric layer at a boundary between the first region and the second region, and a gate structure arranged in the dielectric layer and including a first gate structure section and a second gate structure section arranged on opposite sides of the barrier, wherein the first gate structure section extends across the one or more semiconductor features of the first set and the second gate structure section extends across the one or more semiconductor features of the second set.

The presence of the barrier between the first and the second gate structure sections makes it possible to form the gate structure of the device using the method of the first aspect. The virtues of a structure obtained by the method discussed above apply correspondingly to the second aspect and will therefore not be repeated here.

The first gate structure section may include a stack of a gate dielectric layer (preferably a high-K dielectric layer) formed on the features of the first set, and a second gate conductor. The gate dielectric layer may be formed also on a sidewall of the barrier facing the first gate structure section.

The second gate structure section may include a stack of a gate dielectric layer (preferably a high-K dielectric layer) formed on the features of the second set, and a first gate conductor. The gate dielectric layer may be formed also on a sidewall of the barrier facing the second gate structure section.

The second gate conductor may form a first WFM and the first gate conductor may form a second WFM, different from the first WFM.

The first set of semiconductor features may form an n-channel (or p-channel) and the second gate conductor may form an nWFM (or a pWFM). The second set of semiconductor features may form a p-channel (or n-channel) and the first gate conductor may form a pWFM (or an nWFM).

The device may further comprise a connection layer arranged in the dielectric layer and extending between the first gate structure section and the second gate structure section and above the barrier. The connection layer may electrically connect the first gate structure section and the second gate structure section.

The various material choices of the semiconductor features, the barrier, the gate conductors etc. discussed in connection with the first aspect applies correspondingly to the device aspect.

It is contemplated that the inventive method and the inventive device is applicable to semiconductor features of various types.

The first set of semiconductor features may be a set of one or more elongated semiconductor features and the second set of semiconductor features may be a set of one or more elongated semiconductor features.

The first set of semiconductor features may include a first set of semiconductor fins and the second set of semiconductor features may include a second set of semiconductor fins.

The first set of semiconductor features may include a first set of semiconductor nanowires extending in parallel to a main surface of the substrate and the second set of semiconductor features may include a second set of semiconductor nanowires extending in parallel to the main surface of the substrate.

The first set of semiconductor features may include a first set of semiconductor nanosheets extending in parallel to a main surface of the substrate and the second set of semiconductor features includes a second set of semiconductor nanosheets extending in parallel to the main surface of the substrate.

The nanowires or nanosheets of the first set of semiconductor features may be aligned in a vertical direction in relation to the main surface. Also the nanowires or nanosheets of the second set of semiconductor features may be aligned in the vertical direction.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

DETAILED DESCRIPTION OF CERTAIN ILLUSTRATIVE EMBODIMENTS

A method for forming a gate structure will now be described with reference to the drawings.

Figure 1A:
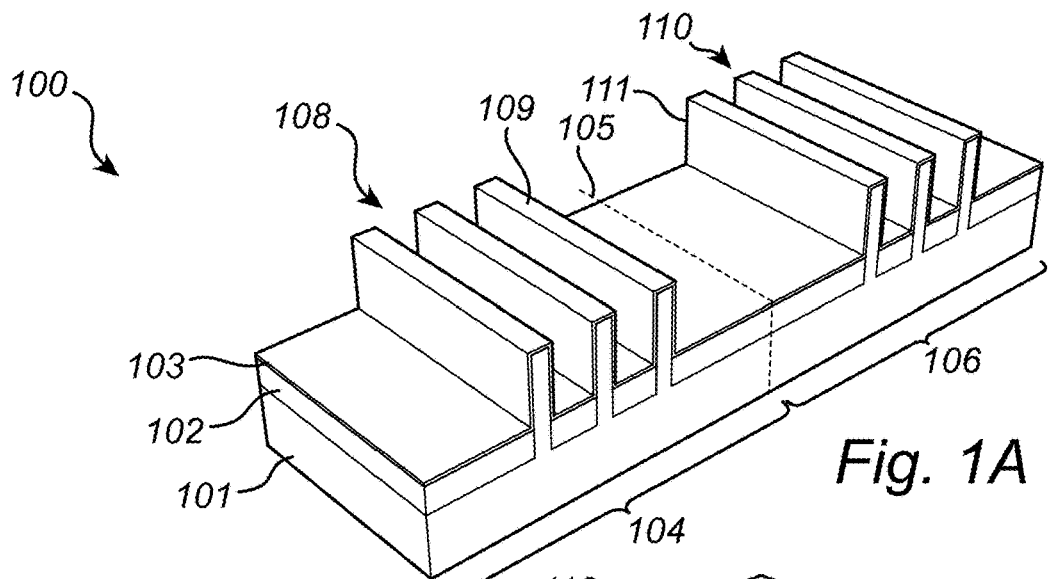
FIGS. 1A-1P illustrate intermediate structures at various stages of fabrication of a gate structure of a semiconductor device using a replacement gate process (RMG), according to embodiments.
Figure 1B:
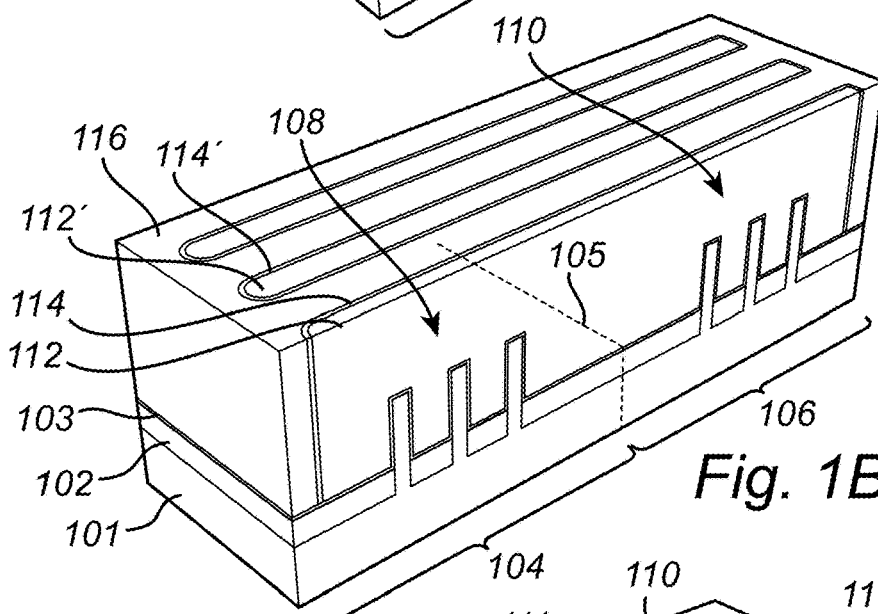
Figure 1C:
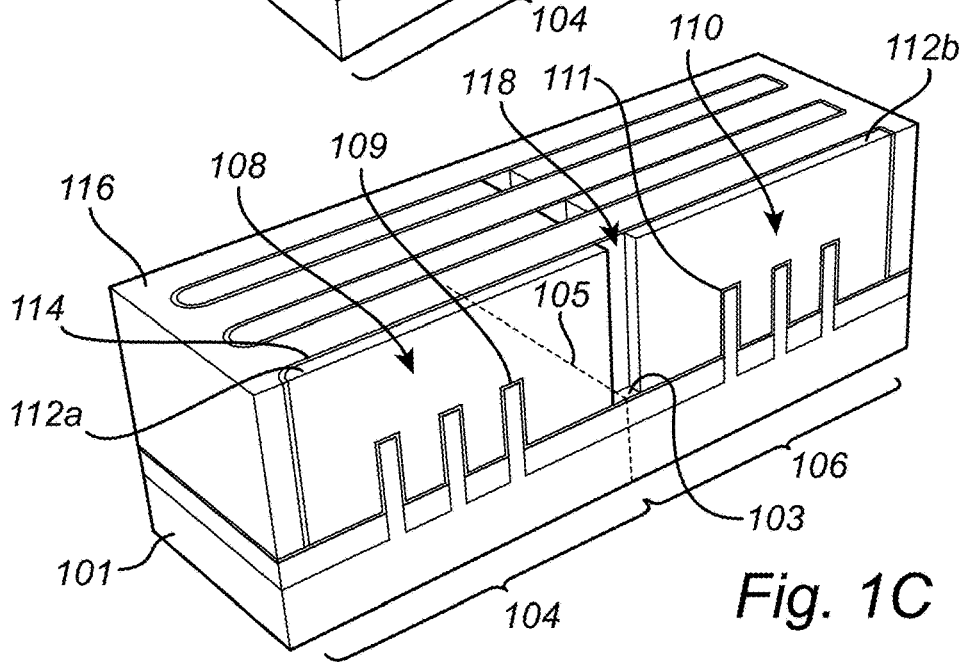
Figure 1D:
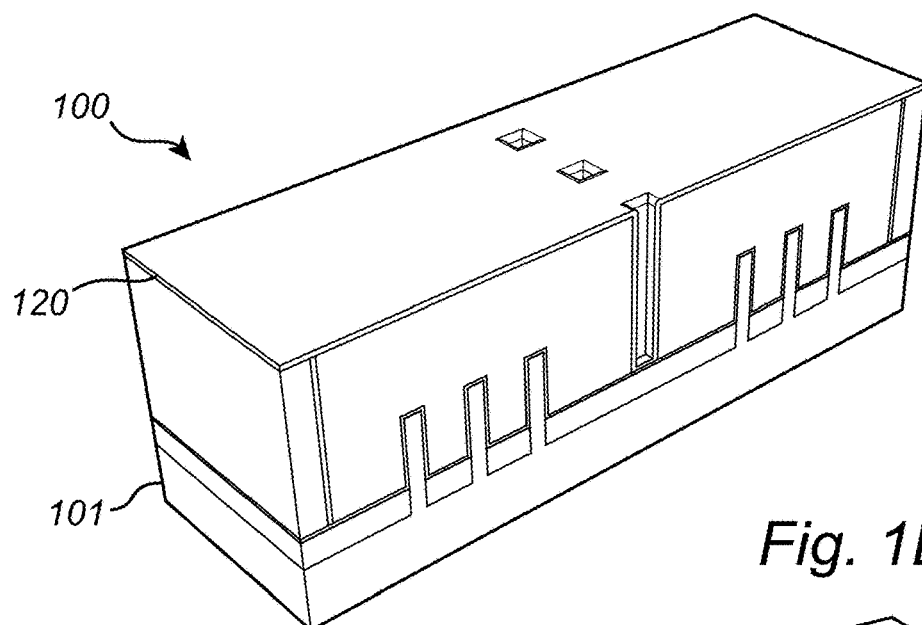
Figure 1E:
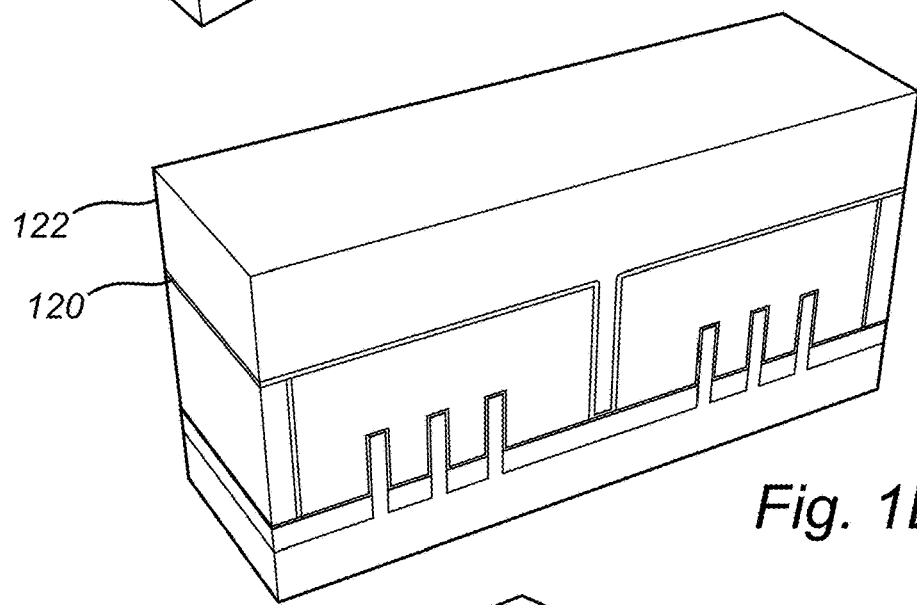
Figure 1F:
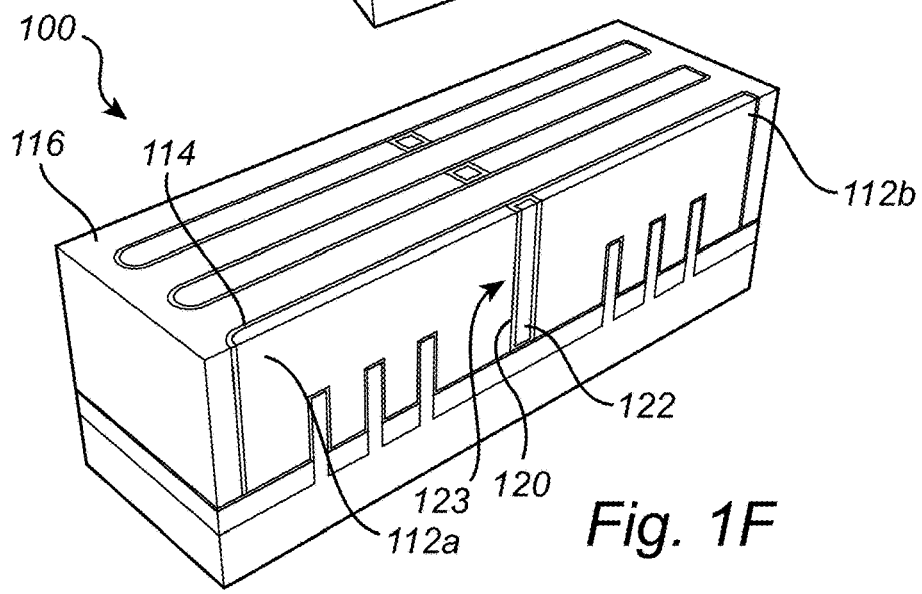
Figure 1G:
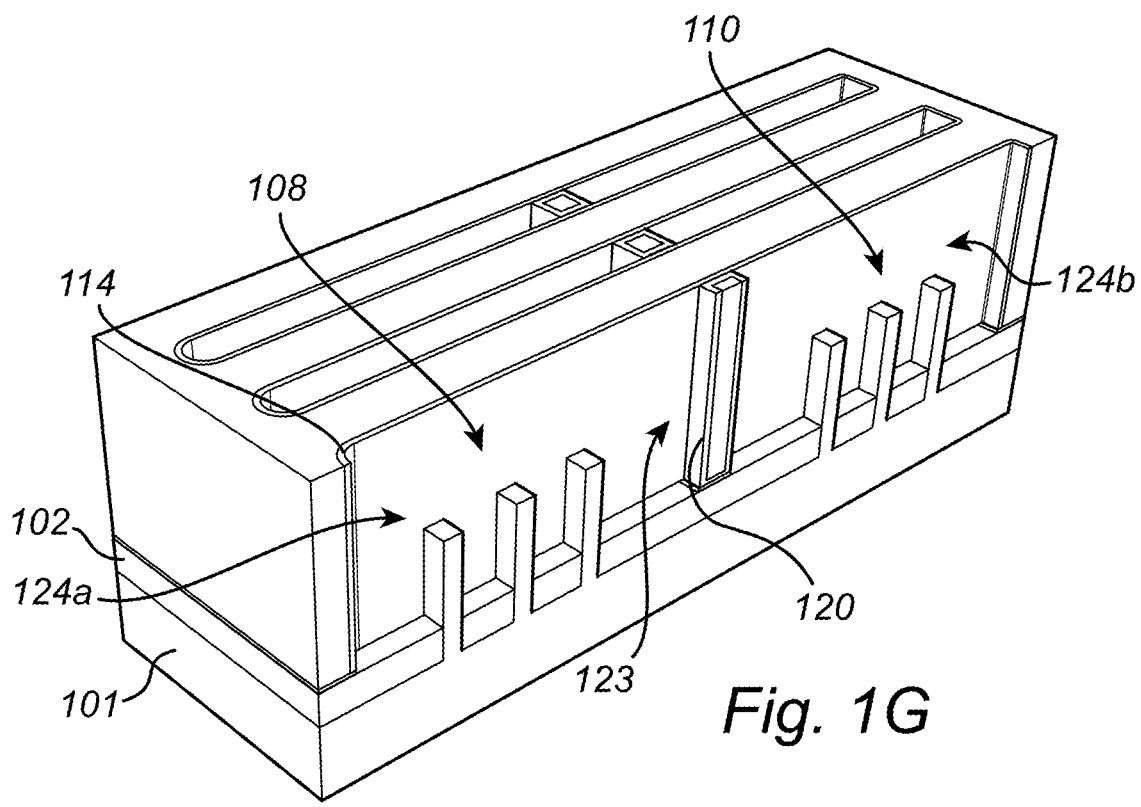
Figure 1H:
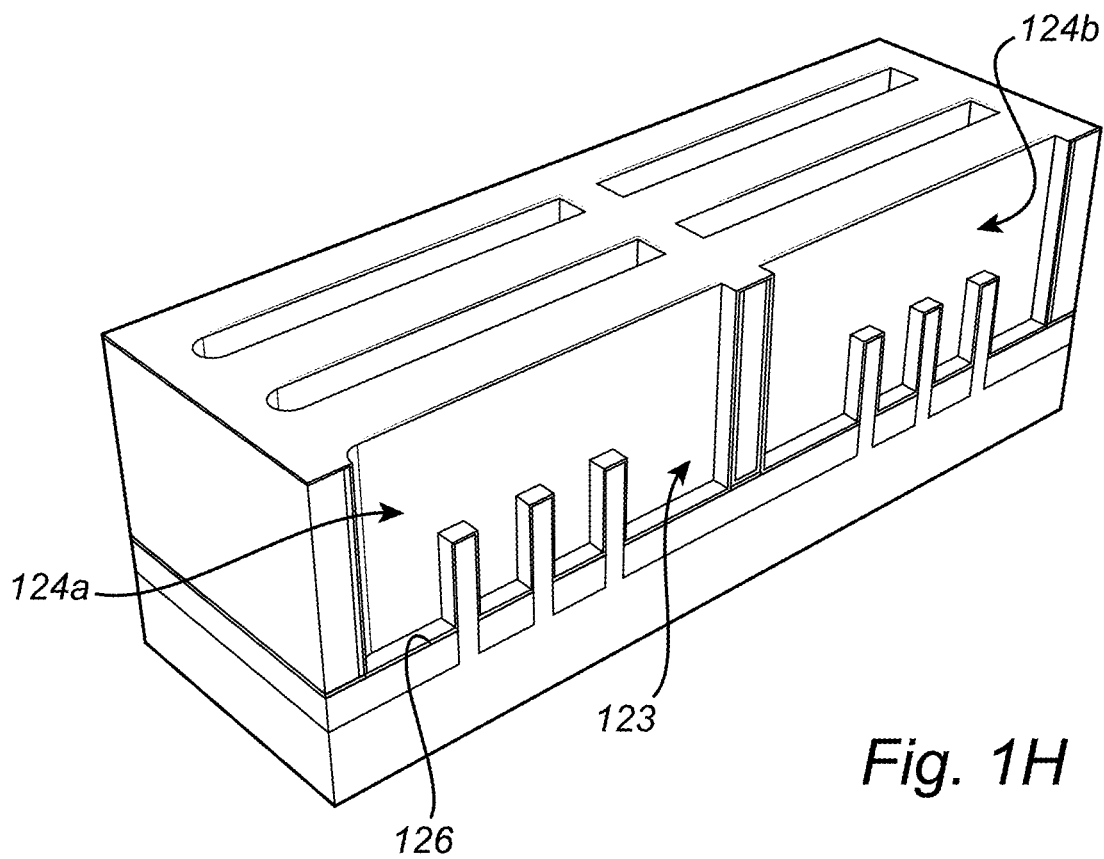
Figure 1I:
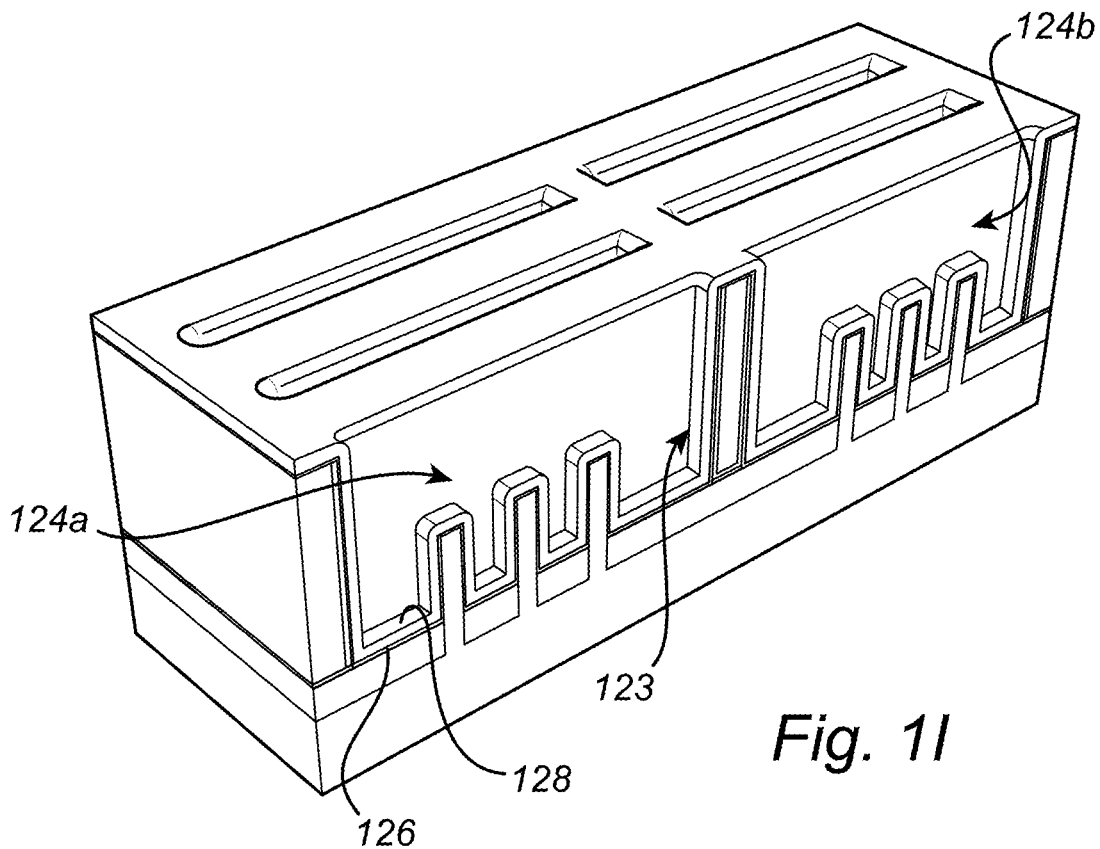
Figure 1J:
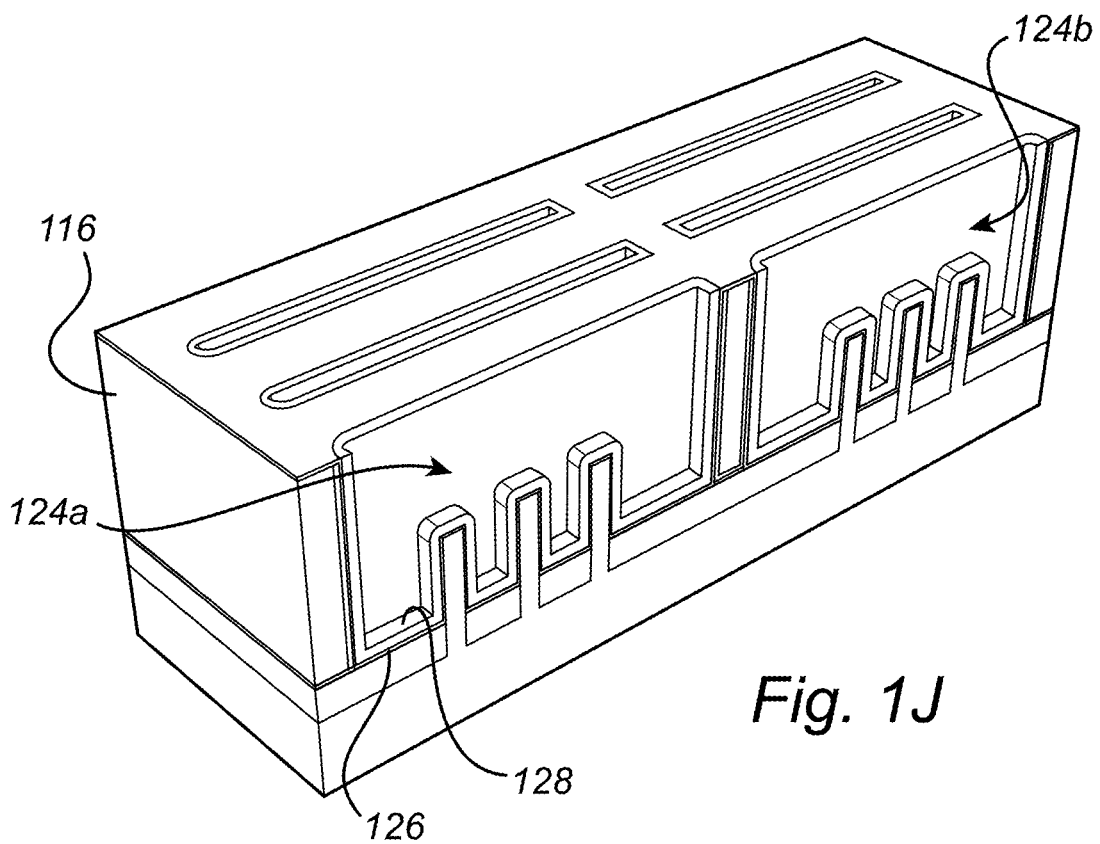
Figure 1K:
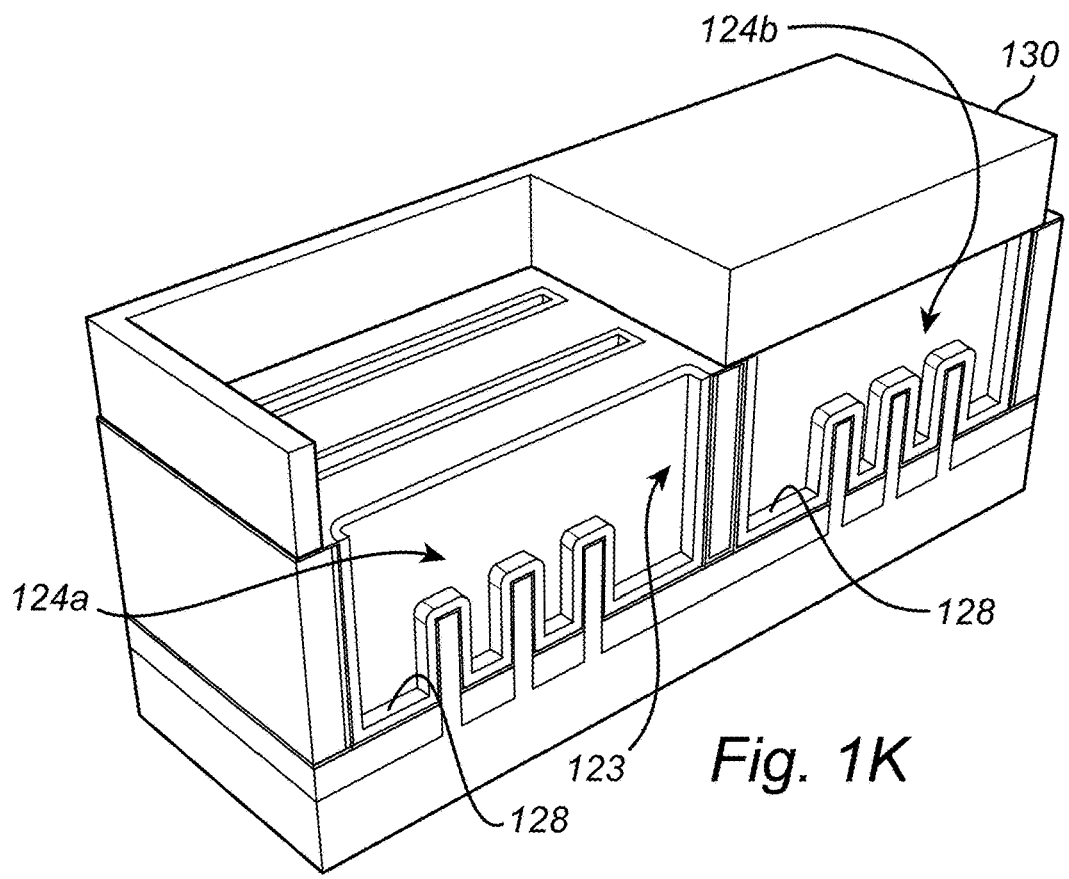
Figure 1L:
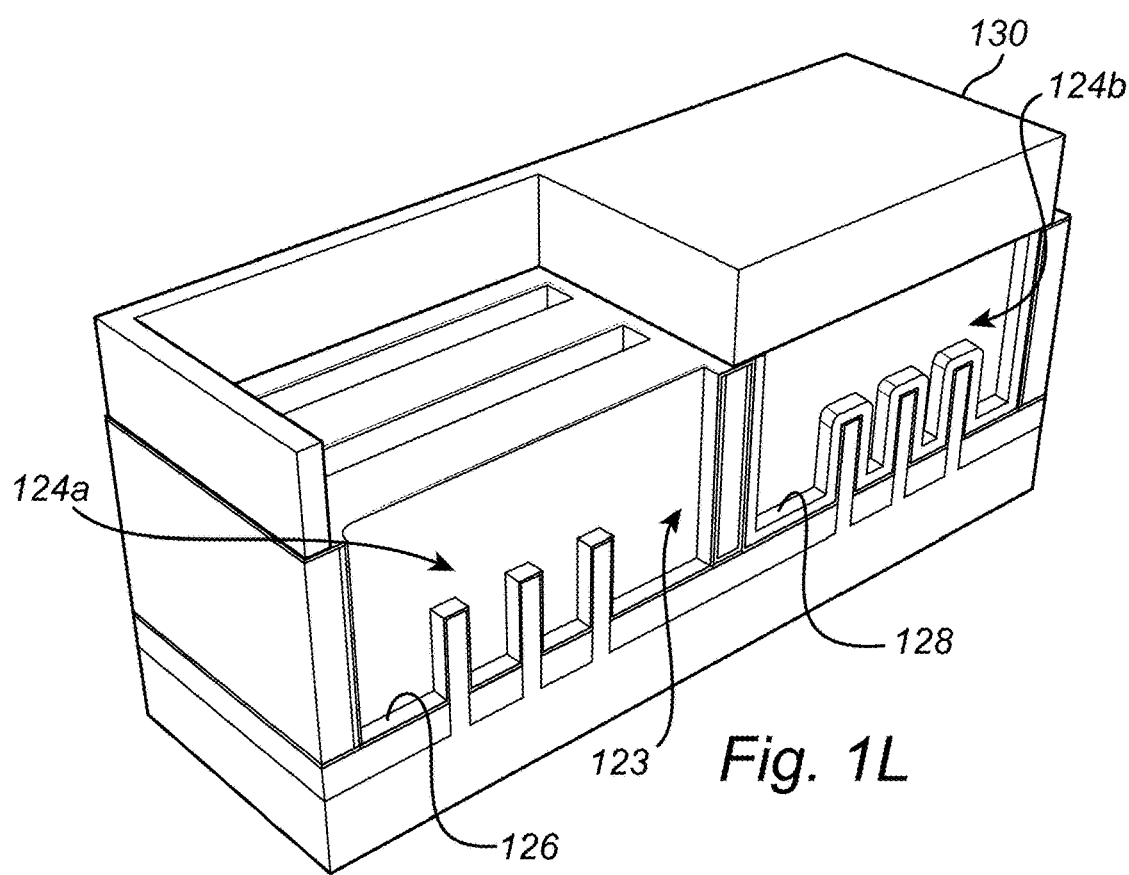
Figure 1M:
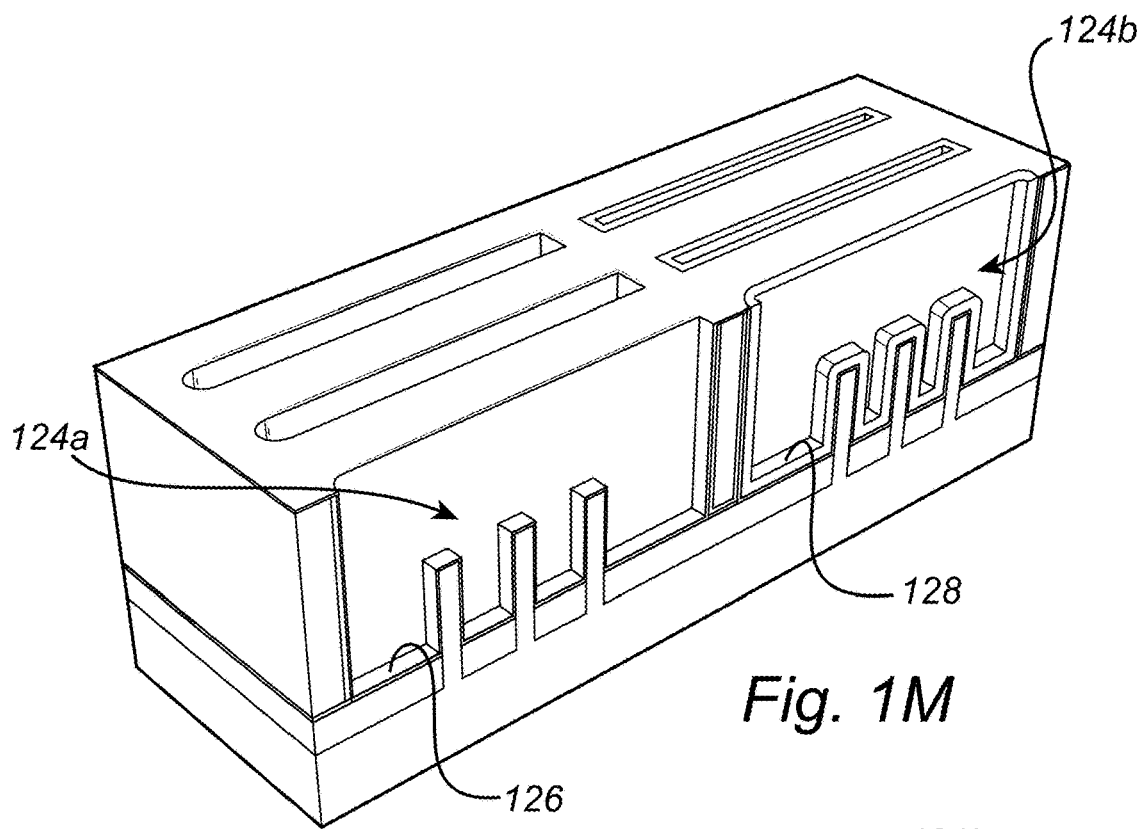
Figure 1N:
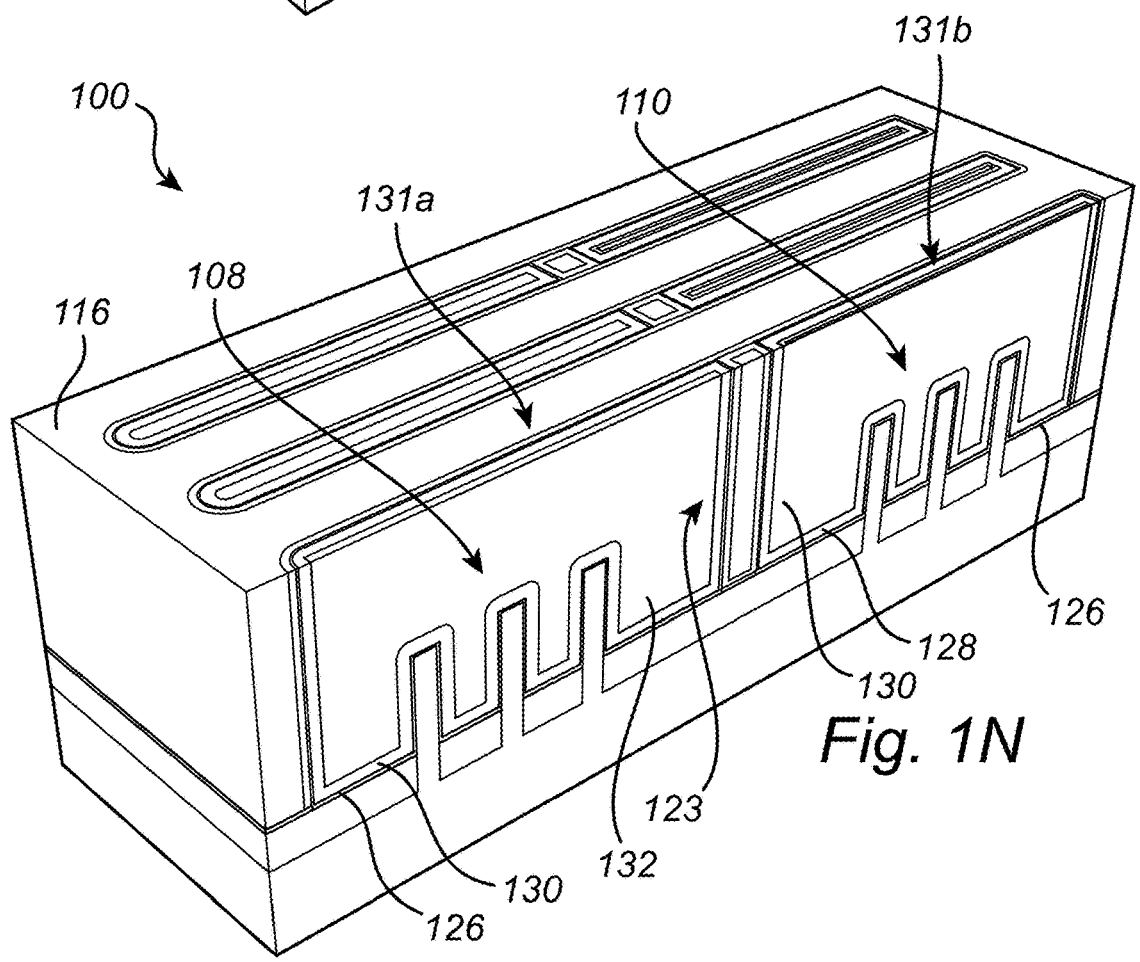
Figure 1O:
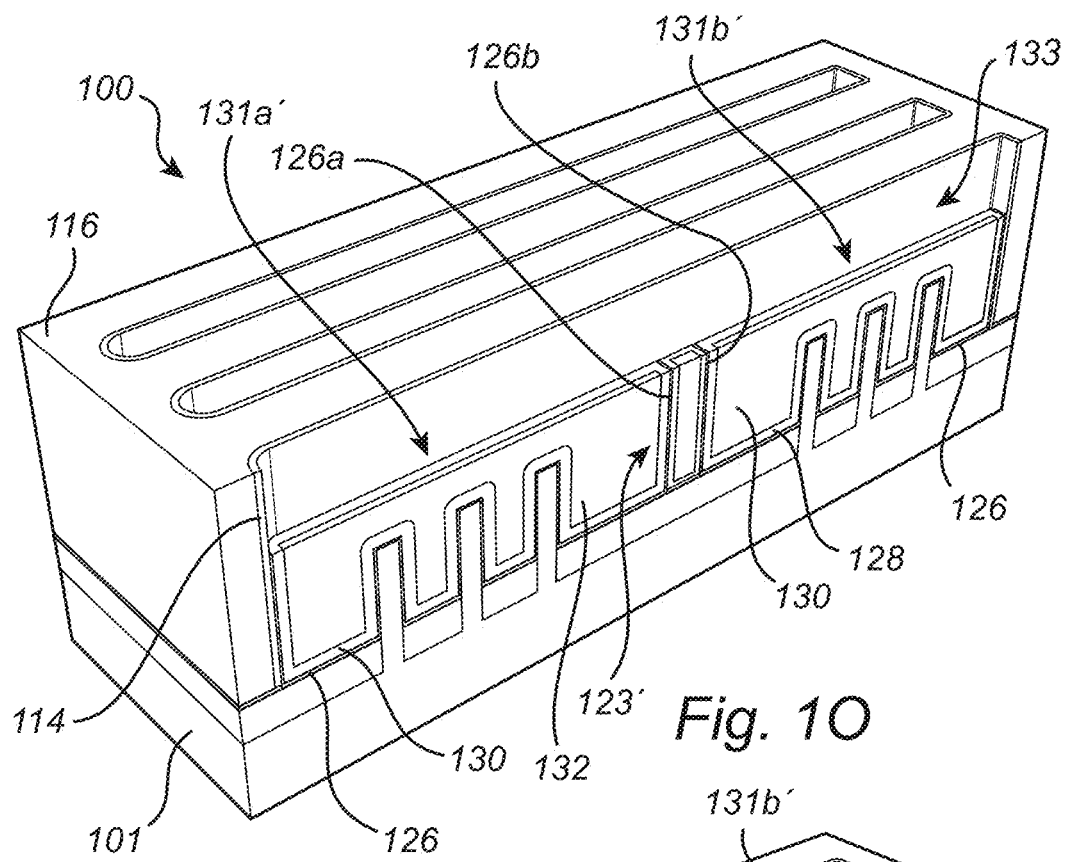
Figure 1P:
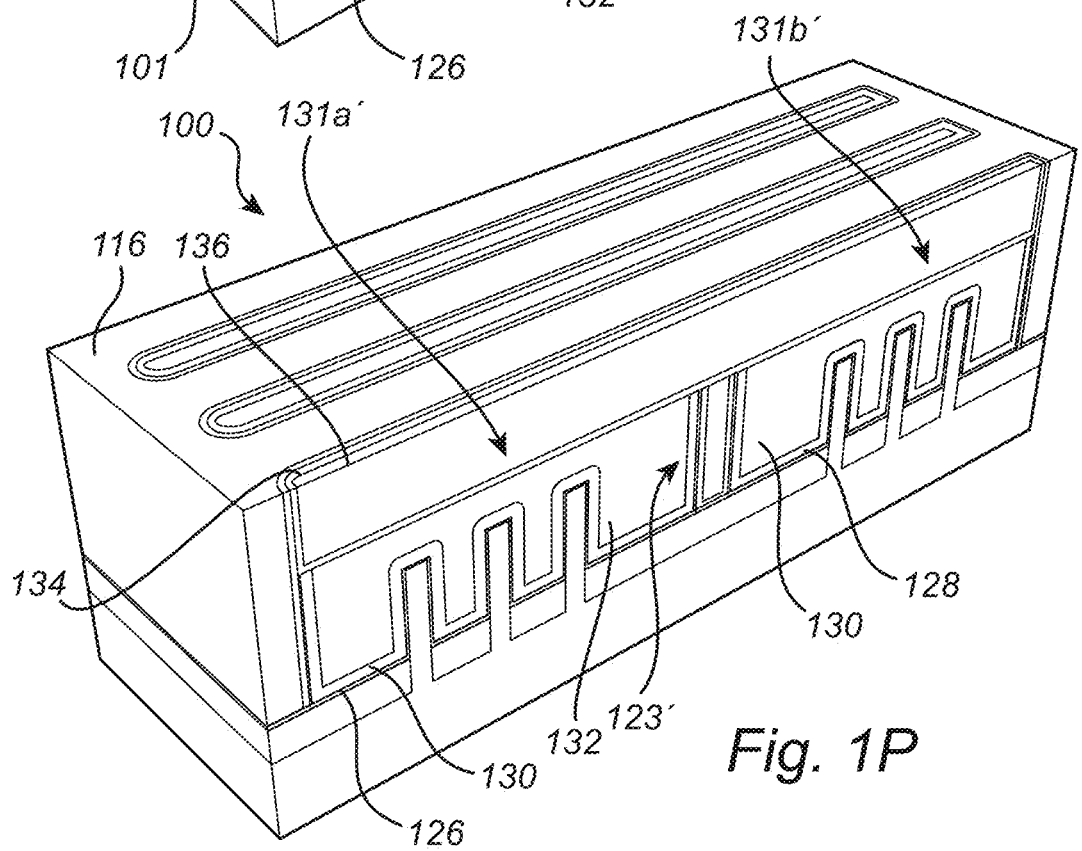

FIGS. 1A-1P show, in perspective, a section of a semiconductor structure 100, at various stages of the method. It will be appreciated that the structure 100 may extend laterally/horizontally beyond the illustrated section. The planes of section through the structure 100 are common to all of the figures.

In FIG. 1A, a first set of semiconductor features 108 and a second set of semiconductor features 110 are formed on a main surface of a substrate 101. The semiconductor features of the first set 108 extend in parallel to each other. The semiconductor features of the second set 110 extend in parallel to each other. The semiconductor features of the first set 108 also extend in parallel to the semiconductor features of the second set 110. In the illustrated embodiment, the first and second sets 108, 110 extend in the same direction. However, embodiments are not so limited and the first and second sets 108, 110 may extend in directions that deviate from being parallel.

In the illustrated embodiment, each of the semiconductor features 108, 110 is formed to be elongated and may be described as having a fin shape and will accordingly be referred to as such in the following. It will be appreciated that in FIG. 1A, each of the first set of fins 108 and the second set of fins 110 include three fins but the method is generally applicable to structures with fewer or greater number of fins in each set. The number of fins of the first set 108 and the second set 110 may be different in some embodiments.

The first set of fins 108 and the second set of fins 110 are formed in, what in the following will be referred to as, a first region 104 and a second region 106, respectively, of the substrate 101. For example, a first region 104 may be doped with a first dopant type and a second region 106 may be doped with a second dopant type.

As will be described below, in later stages of the method, an nMOS device may be formed in the first region 104 and a pMOS device may be formed in the second region 106, or vice versa. Accordingly, the first region 104 may be referred to as an n-region (or p-region) wherein the first set of fins 108 form n-channels (or p-channels) and the second region 106 may be referred to as a p-region (or n-region) wherein the second set of fins 110 form p-channels (or n-channels). The boundary between the first region 104 and the second region 106 may be referred to as the n/p boundary (or p/n boundary) 105.

The substrate 101 may be a semiconductor substrate. The substrate may for instance be a silicon (Si) substrate. The substrate 101 may also be a germanium (Ge) substrate, a silicon germanium (SiGe) substrate, a silicon carbide (SiC) substrate, a silicon on insulator (SOI) substrate, a silicon on glass substrate, a silicon on sapphire substrate, a germanium on insulator substrate, a gallium arsenide (GaAs) substrate, a gallium arsenide phosphide (GaAsP) substrate, an indium gallium arsenide (InGaAs) substrate, an indium phosphide (InP) substrate, or a gallium nitride (GaN) substrate. The substrate 101 may further be a stack of thin layers of two or more of the aforementioned semiconductors. In some embodiments, the substrate 101 may be a silicon-on-insulator (SOI) substrate having a buried insulator formed therein.

The fins of the first set 108 and the second set 110 may be formed of a semiconductor material. The fins of the first set 108 and the second set 110 may be formed by a same semiconductor material or by different semiconductor materials. The semiconductor material of the fins may for instance be the same semiconductor material as for the substrate 101, but the fin material(s) may also be different from the substrate material. The first set of fins 108 and the second set of fins 110 may be formed, for instance, by lithography followed by etching the semiconductor material of the substrate 110 to obtain fins of desired shape and dimensions. Shallow trench isolation (STI) 102 may be formed between the fins of each of the first set 108 and the second set 110. The first set of fins 108 and the second set of fins 110 may also be grown by epitaxy. By way of example, the fins of the first set 108 and the second set 110 may be formed to have a height above the main surface of the substrate 101 of 10-100 nm, where a lower portion of the height may be buried by the STI 102. A separation between the fins within each set may be on the order of a few nanometers. A separation between the innermost fins 109 and 111 may be on the order of tenths of nanometers or even less.

In FIG. 1A a sacrificial gate dielectric 103 has been formed on the first set of fins 108 and the second set of fins 110. The sacrificial dielectric 103 may be formed by an oxide such as silicon oxide ($SiO_2$). A layer of $SiO_2$ may be deposited in a conventional manner to cover the first region 104 and the second region 106 of the substrate 101 and the first set of fins 108 and the second set of fins 110.

In FIG. 1B a sacrificial gate 112 has been formed to extend between the first region 104 and the second region 106 and across the fins of the first set 108 and the fins of the second set 110. In the figures, the front sectional plane is oriented and positioned such that it extends along the sacrificial gate 112, approximately half-way through thickness of the sacrificial gate 112. Accordingly, in FIG. 1B only the far half of the sacrificial gate 112 is visible while the near half of the sacrificial gate 112 is outside the illustrated section of the structure 100.

A spacer layer 114 has been formed on the sidewalls of the sacrificial gate 112. The sacrificial gate 112 may be formed of a polysilicon or amorphous silicon material. The spacer layer 114 may be formed by an insulating material such as $SiO_2$, silicon nitride (e.g. SiN or $Si_3N_4$), silicon oxynitride (SiON) or a low-K dielectric layer such as SiCN, SiOCN, BN or SiBCN. The spacer material may be deposited by ALD or chemical vapor deposition (CVD) to cover the structure 100 and be patterned and then etched to remain only on the sidewalls of the sacrificial gate 112 by anisotropic etching, or any other suitable conventional method.

As shown in FIG. 1B, more than one sacrificial gate such as sacrificial gate 112' with spacer layer 114' may be formed to extend between the first region 104 and the second region 106 and across the fins of the first set 108 and the fins of the second set 110. The number of sacrificial gates depends on the number of gate structures that are to be formed. Reference will in the following mainly be made to the sacrificial gate 112 but the description is applicable to any further sacrificial gate present on the substrate 101.

The one or more sacrificial gates 112 may be formed by, e.g., depositing a sacrificial layer, e.g., a polysilicon layer or an amorphous silicon material layer, to cover the first region 104 and the second region 106 of the substrate 101 and the first set of fins 108 and the second set of fins 110, and subsequently patterning and etching the polysilicon layer or amorphous silicon material layer to form the one or more sacrificial gates 112 with desired dimensions and positions. For instance, a fluorine- or chloride based etchant may be used in a wet-etch process or a dry-etch process such as reactive ion etching (RIE). The spacer layer 114 may thereafter be formed as described above.

As shown in FIG. 1B, the sacrificial gate 112 is arranged in a dielectric layer 116. The dielectric layer 116 may form an interlayer dielectric (ILD), sometimes referred to as a pre-metal interlayer dielectric (PMD), surrounding the gate structure(s) which are to be formed and will be referred to as such in the following. The ILD 116 may be formed subsequent to forming the spacer layers 114, 114' on the sidewalls of the sacrificial gates 112, 112'. The ILD 116 may be formed in a conventional manner by depositing a dielectric material layer to cover the first region 104 and the second region 106, the first set of fins 108 and the second set of fins 110 therein as well as the one or more sacrificial gates 112. The dielectric material may be $SiO_2$, SiN, $Si_3N_4$ or a low-K dielectric such as SiCN, SiOCN, BN, or SiBCN. The dielectric material may be selected to be of a same material as the spacer layer 114 or of a different material than the spacer layer 114. The dielectric material layer may be planarized by chemical mechanical polishing (CMP) stopping when the upper horizontal surface of the sacrificial gate 112 is exposed. The CMP may further remove mask portions remaining on top of the sacrificial gate 112 from the patterning for forming the sacrificial gate 112, if such mask portions still are present on the sacrificial gate 112.

In FIG. 1C, a hole 118 is formed in the sacrificial gate 112 between the first set of fins 108 and the second set of fins 110. The hole 118 is formed by removing a longitudinal section of the sacrificial gate 112 at a position along the sacrificial gate 112 coinciding with the n/p boundary 105. The hole 118 divides the sacrificial gate 112 into a first sacrificial gate section 112a and a second sacrificial gate section 112b. The formation of the hole 118 may be referred to as a gate cut process.

As shown in FIG. 1C, the hole 118 may accordingly be formed approximately at a position halfway between the fin 109 of the first set of fins 108 and the fin 111 of the second set of fins 110. Although an at least approximately symmetric position of the hole 118 may be preferable it is contemplated that a non-symmetric position of the hole 118 between the fins 109 and 111 also would be possible.

The sidewalls of the hole 118 are formed by the spacer layer 114 (i.e. the visible portion of the spacer layer 114 and the portion of the spacer layer 114 on the opposite non-visible sidewall of the sacrificial gate 112) and the sidewalls of the first sacrificial gate section 112a and the second sacrificial gate section 112b facing each other).

The hole 118 may be formed by masking portions of the sacrificial gate 112 which are to remain, for instance using lithography, and subsequently etching the exposed portions of the sacrificial gate 112. For instance a fluorine- or chloride-based etchant may be used for etching the exposed portion of the sacrificial gate 112 in a wet-etch or a dry-etch process such as a reactive ion etch (RIE) process. To facilitate obtaining a hole with vertical sidewalls, an anisotropic dry-etch process may however be preferable. The etching may stop at the sacrificial dielectric 103 (wherein the sacrificial dielectric 103 forms a bottom surface of the hole 118) or may be stopped at the substrate 101 (wherein the substrate 101 forms a bottom surface of the hole 118).

In FIGS. 1D-1F, formation of a barrier 123 between and separating the first sacrificial gate section 112a and the second sacrificial gate section 112b is illustrated. In FIG. 1D a barrier material 120 is deposited in the hole 118. The barrier material 120 may be deposited as a conformal layer on sidewalls inside the hole 118, the sidewalls being formed by the exposed surfaces in the hole 118. The barrier material 120 may also cover the bottom surface of the hole 118. The barrier material 120 may also cover the upper surface of the structure 100 formed by the sacrificial gate 112, the spacer 114 layer and the ILD 116. The barrier material 120 may be deposited by for instance an ALD process.

In FIG. 1E a filler material 122 is deposited to fill any remaining space within the hole 118 (which now is of a reduced dimension due to the presence of the barrier material 120). Deposition of the filler material 122 may be omitted if the barrier material 120 is deposited to completely fill the hole 118. The filler material 122 may be a conducting filler material, for instance being formed by tungsten (W), aluminum (Al) or cobalt (Co) deposited by CVD. It is also possible to deposit a dielectric filler material 122, for instance by ALD.

As shown in FIG. 1E, the filler material 122 may be deposited to cover the barrier material 120 also outside of the hole 118. In FIG. 1F the structure 100 has been planarized wherein filler material 122 and barrier material 120 deposited outside the hole 118 has been removed. The planarization may be achieved by CMP. The planarization process may stop when the upper surface of the sacrificial gate sections 112a and 112b, the spacer layer 114 and the ILD 116 become exposed. The barrier 123 is formed between the first sacrificial gate section 112a and the second sacrificial gate section 112b.

In FIG. 1G, the first sacrificial gate section 112a and the second sacrificial gate section 112b have been removed. A first trench section 124a is formed at the position of the previously present first sacrificial gate section 112a. A second trench section 124b is formed at the position of the previously present second sacrificial gate section 112b. The first sacrificial gate section 112a and the second sacrificial gate section 112b may be removed using a similar process as used for forming the hole 118, as discussed above. The spacer layer 114 is exposed in the trenches 124a, 124b. As may be understood the barrier material 120 (and the filler material 122) is advantageously formed of a material having an etch rate which is lower than an etch rate of the material forming the first sacrificial gate section 112a and the second sacrificial gate section 112b with respect to the etching process used for removing the first sacrificial gate section 112a and the second sacrificial gate section 112b.

In FIG. 1G, also the sacrificial gate dielectric 103 has been removed from the surfaces exposed in the trench sections 124a, 124b. The sacrificial gate oxide 124 may for instance be removed using a conventional etching process and stopping at the semiconductor material forming the fins of the first and second sets 108, 110 and the substrate 101. Optionally, the sacrificial dielectric 103 may be preserved in one or both of the trench sections 124a, 124b wherein the remaining sacrificial dielectric 103 may be used as an interface layer underlying a gate dielectric layer 126 described below.

In FIG. 1H, a gate dielectric layer 126 has been formed on the first and second set of fins 108, 110, and on the bottom and the sidewalls of the first trench section 124a and the second trench section 124b. The sidewalls are formed by the exposed surfaces in the first trench section 124a and the second trench section 124b as shown in FIG. 1G, i.e. the spacer layer 114 and the sidewalls of the barrier 123 facing the first and the second trench sections 124a, 124b. The gate dielectric layer 126 may also cover the upper surface of the structure 100 formed by the sacrificial gate 112, the spacer layer 114, the ILD 116 and the barrier 123. The gate dielectric layer 126 may be deposited as a conformal thin film. The gate dielectric layer 126 may be formed by a high-K dielectric material, for instance $HfO_2$, $ZrO_2$, $Al_2O_3$, $La_2O_3$, $Gd_2O_3$, or other rare-earth oxides or metal oxide silicates such as $HfSiO_x$, $YSiO_x$, or $LaSiO_x$. The gate dielectric layer 126 may be formed by one layer of a high-K dielectric material or by a stack of different high-K dielectric materials. The one or more material layers forming the gate dielectric layer 126 may be deposited for instance by ALD. Optionally, an interface layer (not shown) may be formed in the first trench section 124a and the second trench section 124b prior to forming of the gate dielectric layer 126. The interface layer may be formed by growing a chemical oxide, for instance using $O_3$/de-ionized water ($O_3$/DIW), or by growing a thermal oxide in a conventional manner. The interface layer may be formed by for instance a layer of $SiO_2$.

In an alternative variation of the method, a high-K gate dielectric layer may be formed on the first and second set of fins 108, 110 prior to forming of the sacrificial gate 112 shown in FIG. 1B. In that case, the layer 103 shown inter alia in FIG. 1A may instead of merely forming a "sacrificial gate dielectric" form a high-K gate dielectric layer and accordingly not be removed following the opening of the first trench section 124a and the second trench section 124b illustrated in FIG. 1G.

In FIG. 1I, a first gate conductor 128 has been formed in the first trench section 124a and the second trench section 124b, on the gate dielectric layer 126. The first gate conductor 128 is formed on the sidewalls and the bottoms of the first trench section 124a and the second trench section 124b.

The first gate conductor 128 may be formed by a single metal layer. The first gate conductor 128 may also be formed by a stack of two or more metal layers. The single layer, or each layer of the stack, may be deposited by ALD as a respective conformal layer covering the structure 100, also the upper surface of the structure 100. The thickness of the first gate conductor 128 may vary depending on the trench dimensions. By way of example the thickness of the first gate conductor 128 may be on the order of a few nanometers.

A first gate conductor stack 128 may include a first layer or a bottom layer. The bottom layer may form a buffer layer, counteracting layers higher up in the stack from contaminating the gate dielectric layer 126. The bottom layer may be formed by a material also setting the desired effective work function (eWF) in the second region 106 (possibly in combination with further layers of stack). If the gate dielectric layer 126 is a high-K gate dielectric the bottom layer may be referred to as a high-K capping layer. A first gate conductor stack 128 may include a second layer, above the bottom layer. The second layer may be formed by a material setting the desired eWF of the first gate conductor stack 128 (possibly in combination with further layers of stack). A first gate conductor stack 128 may include an upper layer acting as a barrier layer of the first gate conductor stack 128 with respect to a second gate conductor 130 (which as described below may be deposited on the first gate conductor 128). The barrier layer may reduce the influence of the second gate conductor 130 on the eWF in the second region 106.

Additionally, for the purpose of a subsequent removal of a mask 130 to be described below, a sacrificial layer may be formed to cover the first gate conductor 128. The sacrificial layer may be formed by a material which is sacrificed during the removal of the mask 130. A sacrificial layer may protect the first gate conductor 128 during removal of the mask 130. An upper layer of the first gate conductor 128 (such as the above-mentioned second layer) may act as an etch stop layer below the sacrificial layer during the removal of the mask 130.

The first gate conductor 128 may be formed by one or more metal layers making the first gate conductor 128 suitable as a pMOS work function metal (pWFM) or an nMOS WFM (nWFM) depending on whether the first region 104 or the second region 106 forms an n-region. The pWFM may for instance be formed by a single layer of TiN, TaN, TiTaN or by a stack including TiN (or TaN) as a bottom layer, TaN (or TiN) as a second layer and optionally TiN as an upper layer. The nWFM may for instance be formed by a single layer of Al, TiAl, TiC, or TiAlC or by a stack including TiN as a bottom layer, TiAl as a second layer and optionally TiN as an upper layer. Further examples of nWFM include a stack of (in a bottom-up direction) TiN, TaN, TiAl and TiN, or a stack of TiTaN, TiAl and TiN, or a stack of TiAl and TiN. In all of these example nWFM stacks, TiAl could be replaced with Al, or TiC, or TiAlC.

In FIG. 1J, the first gate conductor 128 deposited outside the first trench section 124a and the second trench section 124b has been removed. The first trench section 124a and the second trench section 124b may be filled with a planarization layer (not shown in FIG. 1J) wherein the first gate conductor 128 present outside the first trench section 124a and the second trench section 124b may be etched back to expose the gate dielectric layer 126 present outside the first trench section 124a and the second trench section 124b. The planarization layer may act as an etch stop during the etch back, counter acting etching of the first gate conductor 128 present inside the first trench section 124a and the second trench section 124b. The planarization layer may for instance be formed by a spin-on-carbon (SOC) layer deposited using a spin deposition process. The planarization layer may following the etch-back of the first gate conductor 128 be removed by etching, for instance using an O₂-based dry etch.

In FIG. 1K, a mask 130 has been formed above the second trench section 124b. Advantageously, the mask 130 is formed to also cover at least a portion of the barrier 130 as shown in FIG. 1K. The mask 130 exposes the first trench section 124a. The mask 130 may be formed by a resist or as a hard mask, for instance a spin-on-carbon/spin-on-glass (SOG/SOC) mask. The extension of the mask 130 may be defined in a conventional manner by removing a region of the SOG/SOC covering the first trench section 124a in a lithography and etching process.

In FIG. 1L, the first gate conductor 128 has been removed from the first trench section 124a by etching. The etch-back has been stopped when the gate dielectric layer 126 is exposed in the first trench section 124a. The first gate conductor 128 (which may be formed by a single layer of by a stack of layers as discussed above) has accordingly been completely removed in the first trench section 124a. During the etching, the mask 130 and the barrier 123 counteracts etching of the first gate conductor 128 present in the second trench section 124b.

If the gate dielectric layer 126 is formed by a high-K dielectric, the gate dielectric layer 126 present in the first trench section 124a on the sidewall of the barrier 123 may act as an etch stop within the first trench section 124a, allowing the first gate conductor 128 to be selectively removed from the first trench section 124a. The barrier 123 may thus counteract under-etching of the mask 130 by virtue of supporting a further layer acting as an etch-stop layer, namely the high-K gate dielectric layer 126. A high-K gate dielectric layer 126 may, as shown in FIG. 1L, also counteract etching of the ILD 116 in regions exposed by the mask 130 outside the first trench section 124a.

If, in a variation of the method, the gate dielectric layer 126 does not provide sufficient etch stopping power or if the gate dielectric layer 126 does not cover the sidewall of the barrier 123 (e.g. due to being deposited in connection with the sacrificial gate process as discussed above), the barrier material 120 itself may be formed by a material acting as a (further) etch stop with respect to the etching of the first gate conductor 128.

A first gate conductor 128 including one or more layers resulting in a pWFM may be etched in the first trench section 124a using a dry etch including for instance sulfur hexafluoride (SF₆) or a wet etch including for instance an ammonia hydroxide-hydrogen peroxide-water mixture (APM) or Tetramethylammonium hydroxide (TMAH). A high-K dielectric layer 126 of a material discussed above may act as an etch stop layer. Alternatively, or additionally, a barrier material 120 of Al, TiAl, TiC, or TiAlC may act as an etch stop layer at the barrier 123. Alternatively, a first gate conductor 128 including one or more layers resulting in an nWFM may be etched in the first trench section 124a using a dry-etch or wet-etch. Also in this case a high-K dielectric layer 126 of for instance HfO₂ may act as an etch stop layer. Alternatively, or additionally, a barrier material 120 of TiN, TaN or TiTaN may act as an etch stop layer at the barrier 123 during the etch back.

In a variation of the method, the first gate conductor 128 may instead of being completely removed from the first trench section 124a only be partially removed. Thus the first gate conductor 128 may be etched to reduce a thickness of the first gate conductor 128 in the first trench section 124a. For instance, if the first gate conductor 128 is formed by a stack of layers the etch back of the first gate conductor 128 in the first trench section 124a may be stopped at or within the bottom layer. By way of example, if the first gate conductor 128 is formed by a stack of TiN, TaN and TiN the etch back may be stopped at or within the bottom TiN layer. The remaining bottom TiN layer in the first trench section 124a may then be used as a bottom layer of a second gate conductor stack 130 to be described below.

In FIG. 1M, the mask 130 has been removed. A SOG layer may be removed by a fluorine-based dry- or wet-etch. A SOC layer may be removed using an O₂-based dry etch. A resist-based mask 130 may be removed using an O₂-based dry etch. To remove resist residues a cleaning step may be performed, for instance using APM. If APM is used in the cleaning step, an upper layer of TiN on a first gate conductor 128 including a stack of TiN and TaN may act as a sacrificial layer and the TaN layer may act as an etch stop layer with respect to the APM.

In FIG. 1N, a second gate conductor 130 has been formed in the first trench section 124a, on the gate dielectric layer 126. The second gate conductor 130 has been formed also in the second trench section 124b on the first gate conductor 128. The second gate conducting material 130 may be deposited to completely fill the first trench section 124a and/or the second trench section 124b (i.e. the space in the second trench section 124b remaining after the first gate conductor 128 has been deposited therein). Otherwise, (as shown in FIG. 1N) a filler material 132 may be deposited to fill a remaining space in the first trench section 124a and/or the second trench section 124b. For illustrative purposes only, in FIG. 1N, to show both of these possibilities, the second gate conducting material 130 is illustrated to be completely filling the second trench section 124b, while only partially filling the first trench section 124a, and the filler material 132 is illustrated as filling the remaining space in the first trench section 124a after being partially filled with the second gate conducting material 130.

The second gate conductor 130 may be formed by a single metal layer or by a stack of two or more metal layers. The single layer, or each layer of the stack, may be deposited by ALD as a respective conformal layer covering the structure 100, also the upper surface of the structure 100. The thickness of the second gate conductor 130 may vary depending on the trench dimensions. By way of example the thickness of the second gate conductor 130 may be on the order of a few nanometers. The above discussion concerning the possible various layers of the first gate conductor 128 applies correspondingly to the second gate conductor 130 and the discussion will therefore not be repeated here.

If the first region 104 forms an n-region the second gate conductor 130 may be formed by one or more layers making the second gate conductor 130 suitable as an nWFM, for instance in accordance with any of the examples discussed in connection with the first gate conductor 128. If the first region 104 forms a p-region the second gate conductor 130 may be formed by one or more layers making the second gate conductor 130 suitable as a pWFM, for instance in accordance with any of the examples discussed in connection with the first gate conductor 128. A filler material 132 may be formed by W, Al or Co deposited by CVD.

In more detail, the structure 100 illustrated in FIG. 1N may be obtained as follows: The second gate conductor 130 may be formed by depositing one or more metal layers inside the first trench section 124a and the second trench section 124b and to cover the gate dielectric layer 126 on the upper surface of the structure 100, outside the trenches 124a, 124b. The filler material 132 may be deposited to cover the second gate conductor 130 deposited in the first trench section 124a, in the second trench section 124b and outside the trenches 124a, 124b. The structure 100 may thereafter be planarized (for instance using CMP), stopping when the ILD 116 is exposed. Accordingly, the filler material 132, the second gate conductor 130 and the gate dielectric layer 126 outside the trenches 124, 124b may be removed.

Hence a semiconductor device has been achieved, including a first gate structure section 131a and a second gate structure section 131b formed at the first region 104 and at the second region 106, respectively. The first gate structure section 131a is formed on the gate dielectric layer 126 and includes the second gate conductor 130 and optionally the filler material 132. The second gate structure section 131b is formed on the gate dielectric layer 126 and includes the first gate conductor 128 and optionally the second gate conductor 130 and the filler material 132. Accordingly, the first gate structure section 131a, in combination with the first set of fins 108 and the gate dielectric layer 126 forms an nMOS (or pMOS) device in the first region 104 and the second gate structure section 131b, in combination with the second set of fins 110 and the gate dielectric layer 126 forms a pMOS (or nMOS) device in the second region 106.

Source and drain electrodes may be connected to the first and second set of fins 108, 110 in regions beyond the illustrated section of the structure, in a conventional manner.

Due to the presence of the gate dielectric layer 126 on the sidewalls of the barrier 123, the first gate structure section 131a and the second gate structure section 131b are electrically disconnected. Hence, if needed the gate structure sections 131a and 131b may in a finished device be electrically connected by forming an interconnection layer on top of the structure 100 shown in FIG. 1N.

An optional addition to the above method for electrically connecting the gate structure sections 131a and 131b will now be described with reference to FIGS. 1O-P.

In FIG. 1O a recess 133 has been formed in the ILD 116. The recess 133 extends between the first region 104 and the second region 106, across the fins of the first set 108 and the fins of the second set 110. The recess 133 may expose sidewalls of the ILD 116 or sidewalls of the spacer layer 114 if present. As may be seen from FIG. 1O, the recess 133 has been formed by reducing a height of the first gate structure section 131a, the barrier 123 and the second gate structure section 131b. Accordingly, corresponding respective structures 131a', 131b', 123' of a reduced height have been formed. Also the gate dielectric layer 126 has been removed in the recess 133. The recess 133 may be formed by etch back (for instance using a dry etch process) of the first gate conductor 128, the second gate conductor 130, the filler material 132, the dielectric 126 and the barrier 123.

In FIG. 1P, a connection layer 134 has been formed in the recess 133. The connection layer 134 is formed by a conductor wherein the first gate structure sections 131a and 131b may be electrically connected, across the barrier 123'. The connection layer 134 may for instance be formed by a same material as the barrier material 120 forming the barrier 123', provided the barrier material 120 is formed by a conducting material. The connection layer 134 may be deposited as a conformal layer on sidewalls inside the recess 133. The connection layer 134 may be deposited for instance by ALD.

In FIG. 1P also a conducting filler material 136 has been deposited on the connection layer 134 to fill any remaining space within the recess 133. The conducting filler material 136 may for instance be formed by W, Al or Co. The filler material 136 may be deposited for instance by CVD. Optionally the connection layer 134 may be deposited to completely fill the recess 133 wherein the filler material 136 may be omitted.

Although not shown in FIG. 1P, the connection layer 134 may following deposition also cover the upper surface of the structure 100, outside the recess 133. Likewise, the filler material 136 may following deposition cover the connection layer 134 also outside the recess 133. Portions of the connection layer 134 and the filler material 136 present outside the recess 133 may be removed by planarization, for instance CMP. The planarization process may stop when the upper surface of the ILD 116 becomes exposed, thereby arriving at the structure 100 shown in FIG. 1P.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For instance, although in the above a first region of an n-type and a second region of a p-type, or vice versa, have been described, the methods are applicable also to a structure having a first region 104 and a second region 106 including a same type of dopant (e.g. n or p) but having different dopant concentrations. Two adjacent regions presenting dopant concentrations may also benefit from selective adjustment of the eWF in the respective regions. The methods of above may accordingly be used for forming, in the first trench section 124a, a first gate structure section including a first WFM providing a first eWF and forming, in the second trench section 124b, a second gate structure section including a second WFM providing a second eWF. Even more generally, the first region 104 and the second region 106 may even have similar properties wherein the methods of above may be used forming, in the first trench section 124a, a first gate structure section including a first WFM providing a first eWF and forming, in the second trench section 124b, a second gate structure section including a second WFM providing a second eWF.

Figure 2:
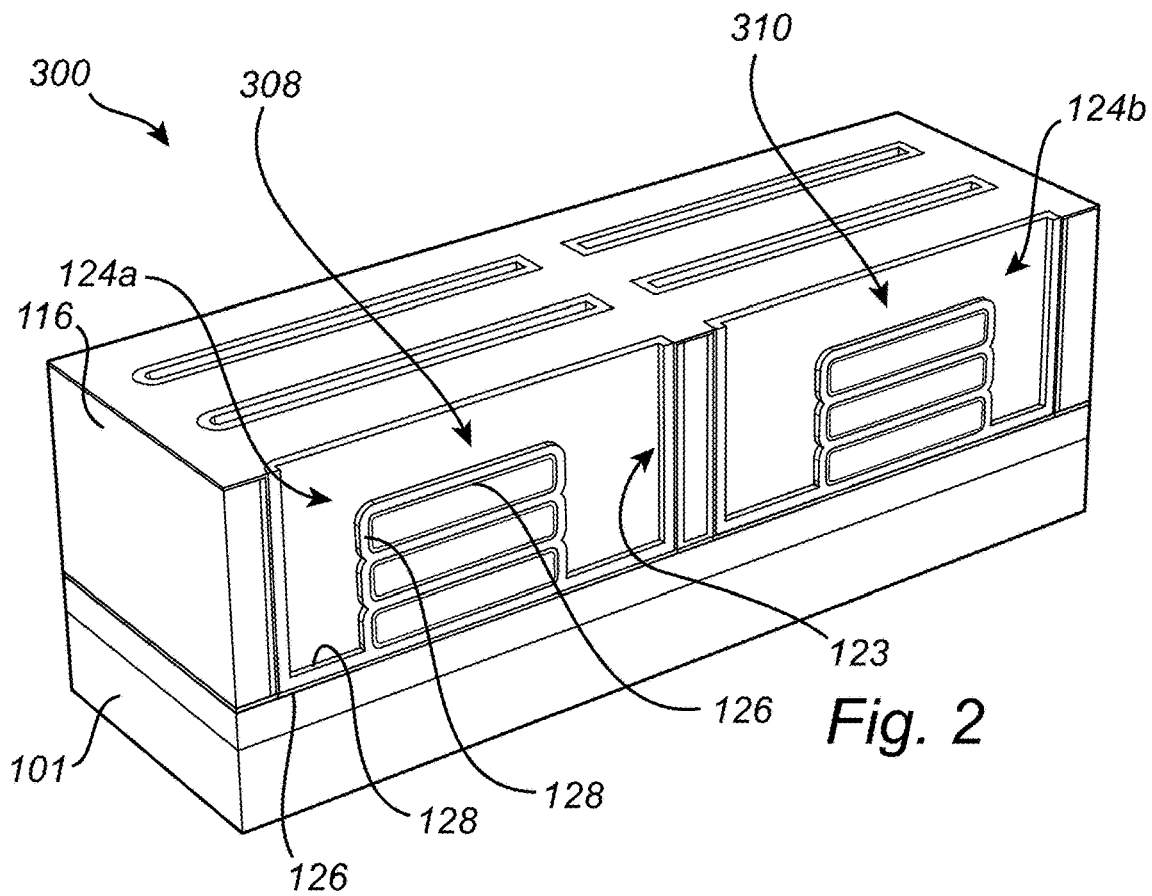
FIGS. 2 and 3 illustrate alternate embodiments of semiconductor devices having gate structures formed by an RMG process, according to embodiments.
Figure 3:
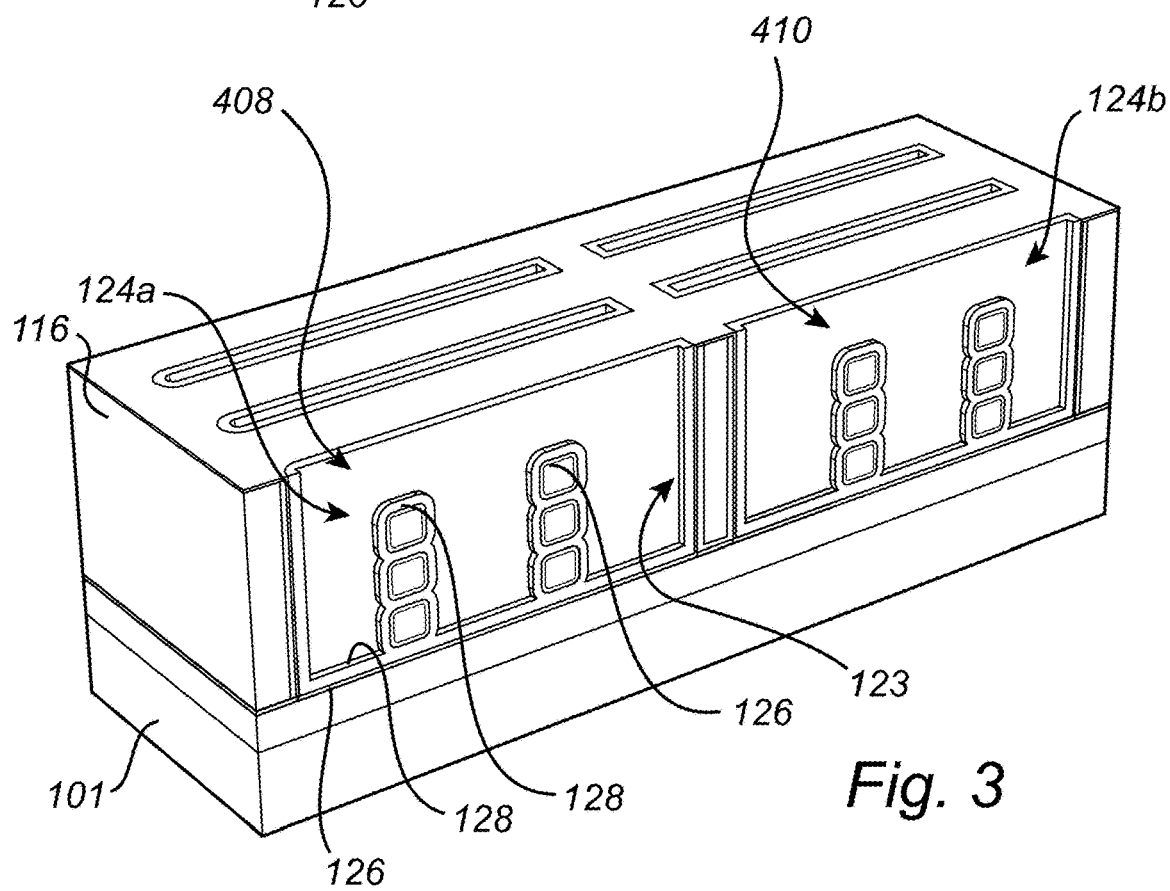

Additionally, the illustrated methods are applicable to other types of semiconductor features than fins. For instance the methods are applicable to planar structures including a first set of one or more planar semiconductor features (for forming a first channel) and a second set of one or more planar semiconductor features (for forming a second channel). FIG. 2 illustrates another structure 300 including a first stack 308 and a second stack 310 of elongated nanosheets, each stack including a number (by way of example three) nanosheets being aligned in a vertical direction in relation to the substrate 101. FIG. 3 illustrates yet another structure 400 including a first set 408 and a second set 410 of a number of stacks (by way of example two) of nanowires, each such stack including a number (by way of example three) nanowires aligned in a vertical direction in relation to the substrate 101.

Stacks of nanosheets or stacks of nanowires may for instance be formed by performing an anisotropic etch of a semiconductor material in a vertical direction in relation to the substrate 101 (to form the outline of each stack) and another anisotropic etch in a horizontal/lateral direction (to form the separate nanosheets or nanowires within each stack). The detailed manner of forming such stacks is per se known to the skilled person and will not be further elaborated upon herein.

The structure 300 and the structure 400 are illustrated at a stage of the method corresponding to FIG. 1J, i.e. subsequent to opening of the first and the second trench sections 124a, 124b in the ILD 116 and subsequent to deposition of the gate dielectric layer 126 and the first gate conductor 128. By using ALD for deposition of the layers 126 and 128 the portions of the nanosheets or nanowires exposed in the first and the second trench sections 124a, 124b may be completely conformally coated with the layers 126 and 128. The method described in connection with FIGS. 1A-P is compatible with the structures shown in FIGS. 300 and 400 with the addition that the etching processes used for removing material within the trench sections at various stages of the methods, preferably include isotropic wet etchants to facilitate removal of material also from surfaces of the nanosheets or nanowires facing downwardly, i.e. toward the substrate 101.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a gate structure of a semiconductor device, the method comprising:
   providing a substrate having a first region including a first set of one or more semiconductor features elongated in a first direction and a second region adjacent to the first region and including a second set of one or more semiconductor features elongated in the first direction, wherein a sacrificial gate is arranged in a dielectric layer and extends in a second direction crossing the first direction across the one or more semiconductor features of the first set and the one or more semiconductor features of the second set;
   forming a hole by etching the sacrificial gate at a boundary between the first region and the second region to divide the sacrificial gate into a first sacrificial gate section and a second sacrificial gate section and to expose a portion of the substrate;
   forming a barrier in the hole by depositing a barrier material layer conformally on a sidewall of the first sacrificial gate section, a sidewall of the second sacrificial gate section, and the portion of the substrate, and depositing a filler material on the barrier material so to fill a remaining space in the hole, wherein the filler material does not physically contact the portion of the substrate;
   removing the first sacrificial gate section to form a first trench section in the dielectric layer at the first region and removing the second sacrificial gate section to form a second trench section in the dielectric layer at the second region;
   forming a first gate conductor in the first trench section and in the second trench section;
   forming a mask over the second trench section, wherein the mask laterally extends to cover at least a portion of the barrier while exposing the first trench section;
   etching the first gate conductor in the first trench section, wherein the mask and the barrier counteracts etching of the first gate conductor in the second trench section; and forming a second gate conductor in the first trench section,
   wherein a first gate structure section including the second gate conductor is formed in the first trench section and a second gate structure section including the first gate conductor is formed in the second trench section,
   further comprising electrically connecting the first gate structure section to the second gate structure section,
   wherein electrically connecting comprises:
   subsequent to forming the second gate conductor, forming in the dielectric layer over the first and second sets of one or more semiconductor features a recess extending in the second direction between the first trench section and the second trench section, and
   depositing a connection layer conformally on the sidewalls of the recess for electrically connecting the first gate conductor in the second trench section to the second gate conductor in the first trench section.

2. A method according to claim 1, wherein etching the first gate conductor in the first trench section is performed to completely remove the first gate conductor from the first trench sections.

3. A method according to claim 1, further comprising filling a remaining space in the recess by depositing a conducting filler material on the connection layer in the recess.

4. A method according to claim 1, further comprising: subsequent to depositing the barrier in the hole and filling the remaining space in the hole with a filler material, removing portions of the barrier and the filler material deposited outside the hole by chemical mechanical polishing.

5. A method according to claim 1, further comprising, prior to depositing the first gate conductor, depositing a high-K gate dielectric layer on exposed surfaces in the first trench section and the second trench section, wherein the first gate conductor is formed on the gate dielectric layer.

6. A method according to claim 5, wherein the exposed surfaces in the first trench section includes a surface formed by a sidewall of the barrier facing the first trench section, and wherein the high-K gate dielectric layer is deposited on the surface of the sidewall of the barrier and counteracts etching of the first gate conductor in the second trench section during the act of etching the first gate conductor from the first trench section.

7. A method according to claim 1, wherein the sacrificial gate is arranged on a sacrificial dielectric and the method further comprises, subsequent to removing the first sacrificial gate section and the second sacrificial gate section, and prior to depositing the gate dielectric, removing the sacrificial dielectric by etching the sacrificial dielectric from exposed surfaces in the first trench section and/or the second trench section.

8. A method according to claim 1, wherein a spacer layer is formed on sidewalls of the sacrificial gate.

9. A method according to claim 1, wherein forming the first gate conductor includes depositing one or more metal layers in the first trench section and in the second trench section, and wherein forming the second gate conductor includes depositing one or more metal layers in the first trench section.

10. A method according to claim 1, further comprising forming the second gate conductor on the first gate conductor in the second trench section.

11. A method according to claim 1, further comprising:
subsequent to forming the second gate conductor, filling a remaining space in the first trench section with a filler material.

12. A method of forming a complementary metal oxide (CMOS) device, the method comprising:
forming a plurality of first elongated semiconductor active structures extending in a first direction and doped with a dopant of a first type;
forming a plurality of second elongated semiconductor active structures extending in the first direction and doped with a dopant of a second type;
forming a sacrificial gate line over and traversing the first and second active structures in a second direction crossing the first direction;
removing a portion of the sacrificial gate line between the first and second elongated semiconductor active structures so as to form a hole dividing the sacrificial gate line into a first sacrificial gate line section and a second sacrificial gate line section and to exposing a portion of a substrate;
forming a pillar structure in the hole by depositing a barrier material conformally on a sidewall of the first sacrificial gate line section, a sidewall of the second sacrificial gate line section and the portion of the substrate, and depositing a filler material on the barrier material so as to fill any remaining space in the hole, wherein the filler material does not physically contact the portion of the substrate;
removing selectively against the barrier material remaining portions of the sacrificial gate line, thereby forming a first empty volume by removing a first remaining portion of the sacrificial gate line over the first elongated semiconductor active structures, and forming a second empty volume by removing a second remaining portion of the sacrificial gate line over the second elongated semiconductor active structures;
depositing a first gate metal layer having a first work function in the first and second empty volumes; and
replacing the first gate metal layer in the first empty volume with a second gate metal layer having a second work function, wherein the first and second work functions are different by at least 0.5 eV.

13. The method of claim 12, wherein the pillar structure is elongated in a third direction crossing the first and second directions.

14. The method of claim 12, wherein each of the first and second elongated semiconductor active structures comprises a fin structure protruding between adjacent shallow trench isolation structures extending in the first direction.

15. The method of claim 12, wherein each of the first and second elongated semiconductor active structures comprises a nanosheet or a nanowire.

16. A method according to claim 1, wherein the depositing a connection layer is by ALD.

17. The method according to claim 5, wherein the high-K dielectric conformally covers the first set of one or more semiconductor features and extends to cover a sidewall the barrier in the first trench section to serve as a further barrier during etching the first gate conductor in the first trench section.

* * * * *